(12) United States Patent
Conrad et al.

(10) Patent No.: US 11,639,718 B2
(45) Date of Patent: May 2, 2023

(54) MICROMECHANICAL DEVICES WITH MECHANICAL ACTUATORS

(71) Applicant: Fraunhofer-Gesellschaft zur Foerderung der angewandten Forschung e.V., Munich (DE)

(72) Inventors: Holger Conrad, Dresden (DE); Matthieu Gaudet, Cottbus (DE); Harald Schenk, Dresden (DE); Sebastian Uhlig, Cottbus (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 897 days.

(21) Appl. No.: 16/507,932

(22) Filed: Jul. 10, 2019

(65) Prior Publication Data
US 2019/0337798 A1    Nov. 7, 2019

Related U.S. Application Data

(63) Continuation of application No. PCT/EP2018/050469, filed on Jan. 9, 2018.

(30) Foreign Application Priority Data

Jan. 10, 2017  (DE) .......................... 102017200308.1

(51) Int. Cl.
*F16K 99/00* (2006.01)
*F04B 49/00* (2006.01)
(Continued)

(52) U.S. Cl.
CPC .......... *F04B 49/007* (2013.01); *B81B 7/0003* (2013.01); *B81B 7/007* (2013.01);
(Continued)

(58) Field of Classification Search
CPC .................................................. F16K 99/0048
See application file for complete search history.

(56) References Cited

U.S. PATENT DOCUMENTS

| | | | |
|---|---|---|---|
| 2005/0199301 A1* | 9/2005 | Frisch | F16K 31/006 137/625.65 |
| 2006/0266981 A1 | 11/2006 | Asaka et al. | |

(Continued)

FOREIGN PATENT DOCUMENTS

| | | |
|---|---|---|
| CN | 103282706 A | 9/2013 |
| CN | 103370866 A | 10/2013 |

(Continued)

*Primary Examiner* — Benjamin P Sandvik
(74) *Attorney, Agent, or Firm* — Perkins Coie LLP; Michael A. Glenn

(57) ABSTRACT

A planar micromechanical actuator suspended on opposing suspension zones including a neutral axis between the opposing suspension zones, first to fourth segments into which the planar micromechanical actuator is segmented between the opposing suspension zones, each including a first electrode and a second electrode which form a capacitor and are isolatedly affixed to each other at opposite ends of the respective segment along a direction between the opposing suspension zones so as to form a gap between the first and second electrode along a thickness direction, the gap being offset to the neutral axis along the thickness direction, and wherein the first to fourth segments are configured such that the planar micromechanical actuator deflects into the thickness direction by the first and fourth segment bending into the thickness direction and the second and third segments bending contrary to the thickness direction upon a voltage being applied to the first and second electrodes of the first to fourth segments.

33 Claims, 29 Drawing Sheets

(51) Int. Cl.
*B81B 7/00* (2006.01)
*F04B 43/14* (2006.01)
*F04B 43/04* (2006.01)
*F04B 1/063* (2020.01)

(52) U.S. Cl.
CPC ............ *F04B 1/063* (2013.01); *F04B 43/046* (2013.01); *F04B 43/14* (2013.01); *F16K 99/0042* (2013.01)

(56) References Cited

U.S. PATENT DOCUMENTS

| | | | |
|---|---|---|---|
| 2008/0149869 A1* | 6/2008 | Shannon | F16K 99/0051 251/129.01 |
| 2012/0032559 A1* | 2/2012 | Hino | H01L 41/193 310/330 |
| 2013/0299015 A1 | 11/2013 | Penterman et al. | |
| 2013/0315757 A1 | 11/2013 | Tsuboi et al. | |
| 2015/0109372 A1 | 4/2015 | Aida et al. | |
| 2016/0304333 A1 | 10/2016 | Gaudet et al. | |
| 2016/0341337 A1 | 11/2016 | Govyadinov et al. | |
| 2016/0351366 A1* | 12/2016 | Lisec | H01H 57/00 |
| 2017/0097108 A1* | 4/2017 | Huff | F16K 99/0038 |
| 2018/0069168 A1 | 3/2018 | Ikeuchi et al. | |
| 2018/0179048 A1* | 6/2018 | Schenk | H04R 9/02 |

FOREIGN PATENT DOCUMENTS

| | | |
|---|---|---|
| CN | 104576915 A | 4/2015 |
| CN | 105940249 A | 9/2016 |
| CN | 106163979 A | 11/2016 |
| DE | 102015210919 A1 | 12/2016 |
| WO | 2005057772 A1 | 6/2005 |
| WO | 2012095185 A1 | 7/2012 |
| WO | 2015069960 A1 | 5/2015 |
| WO | 2016175013 A1 | 11/2016 |

* cited by examiner

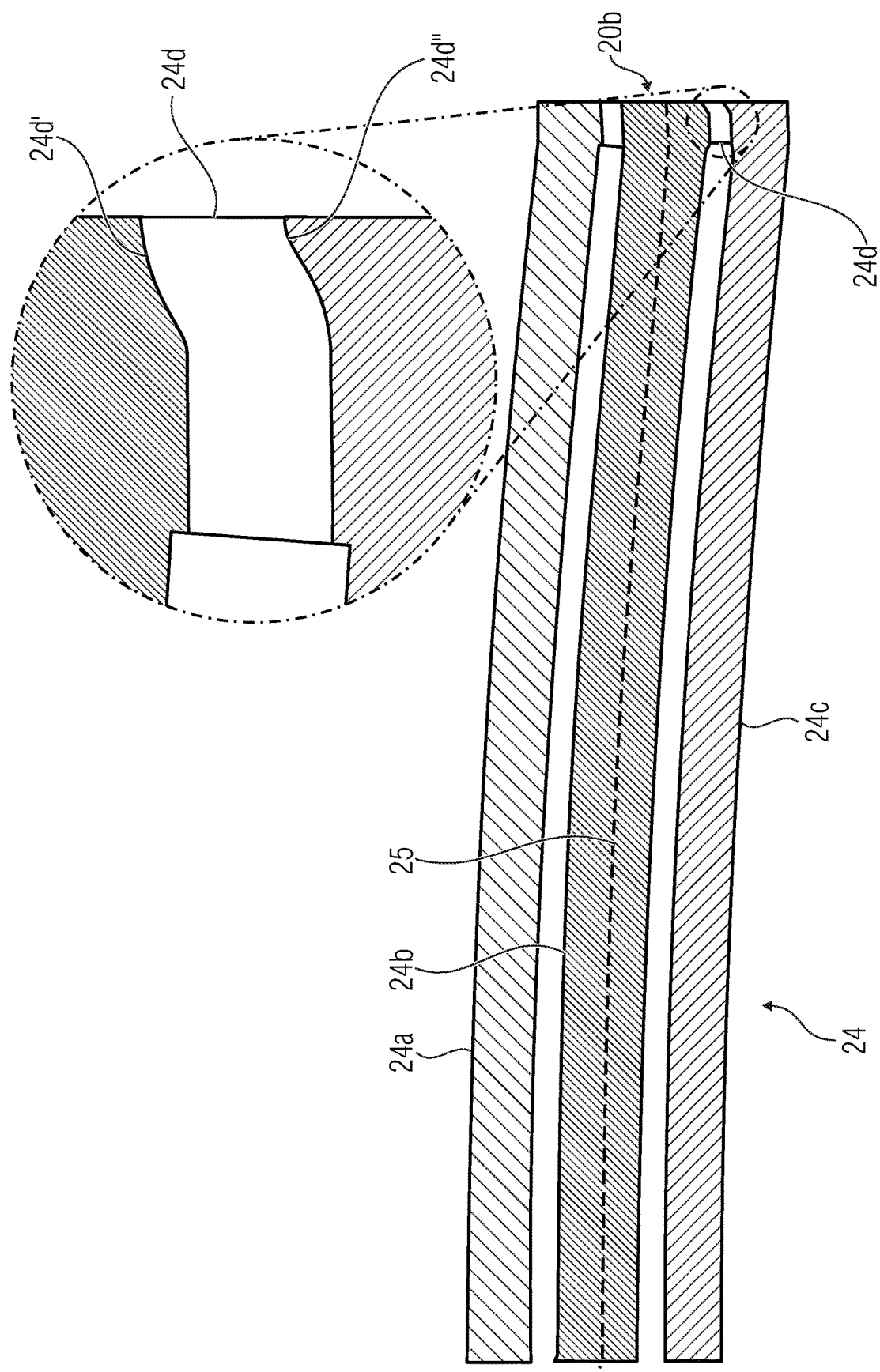

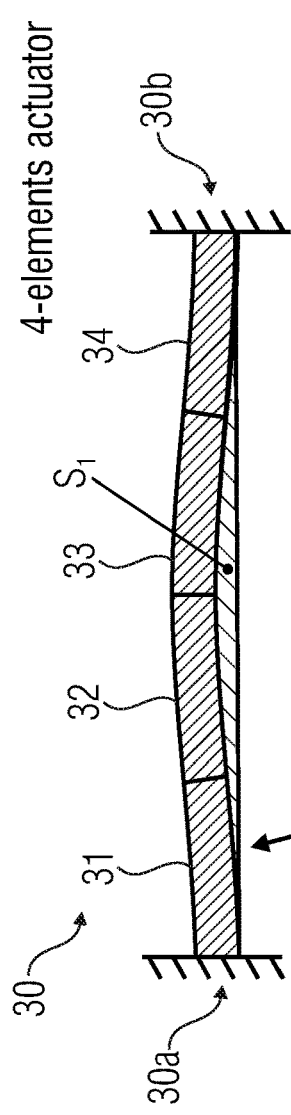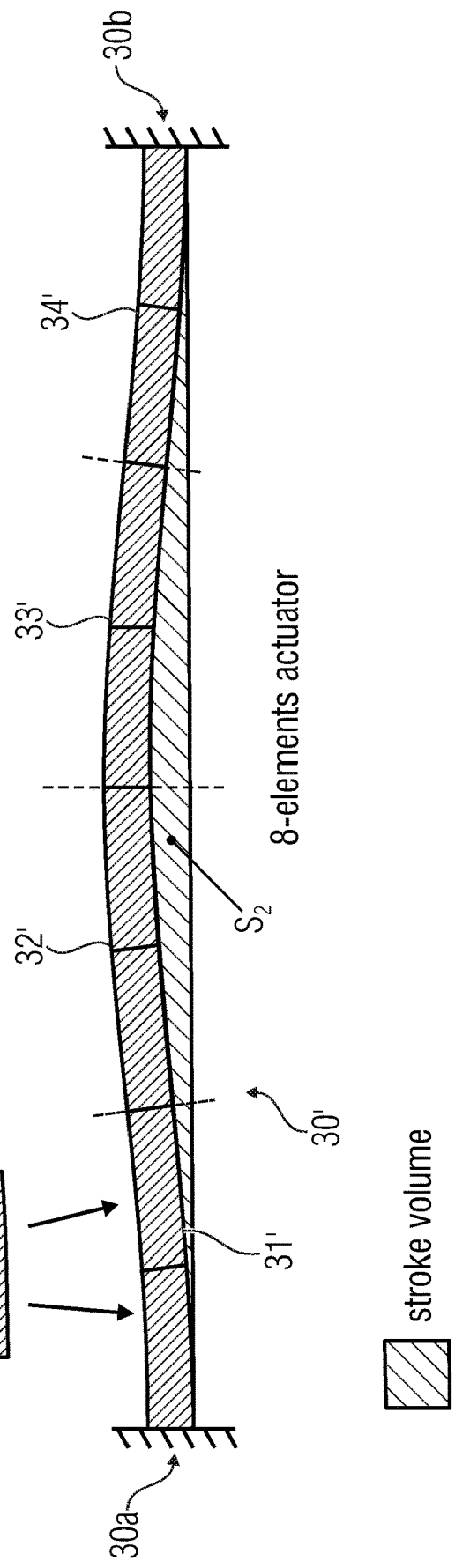

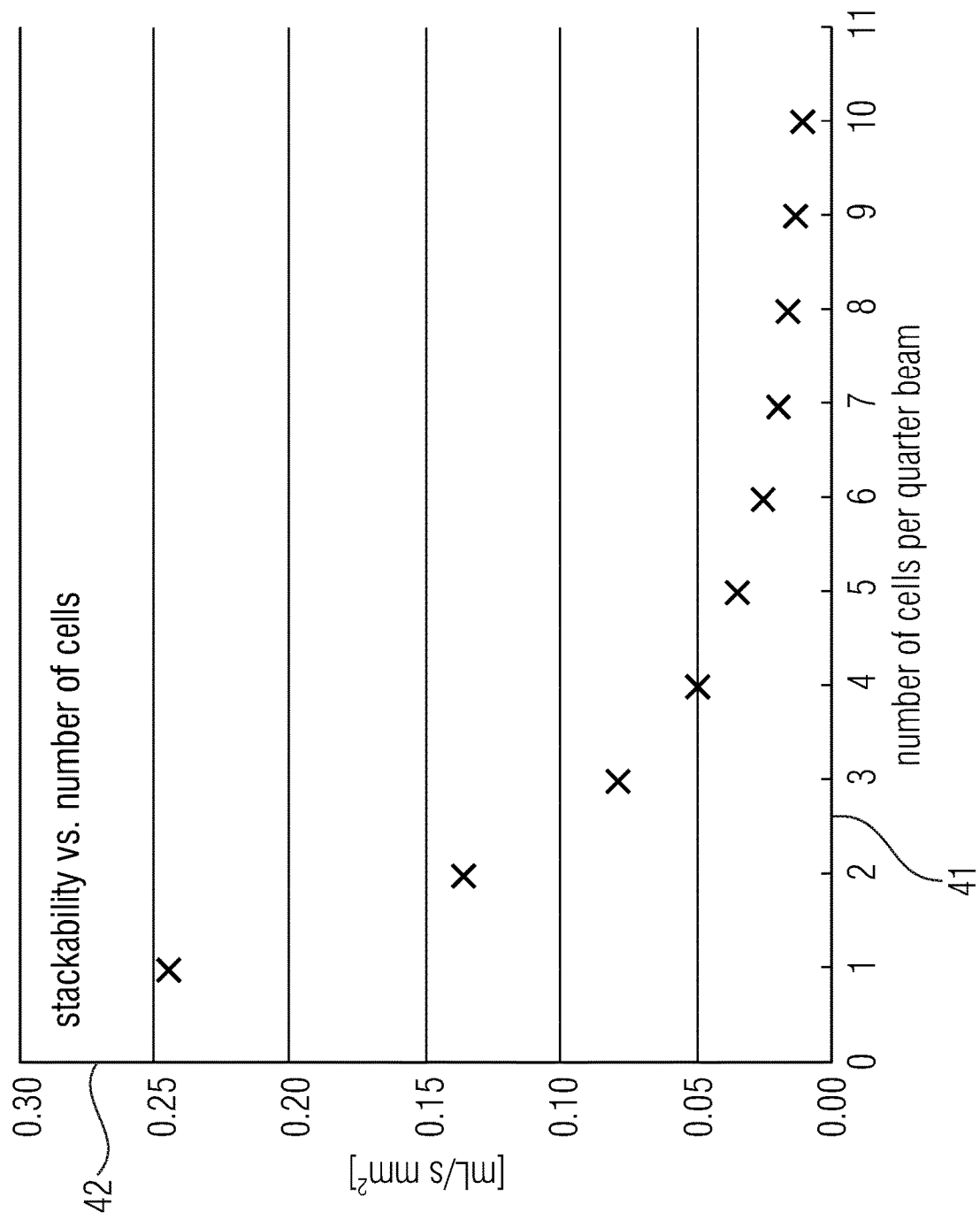

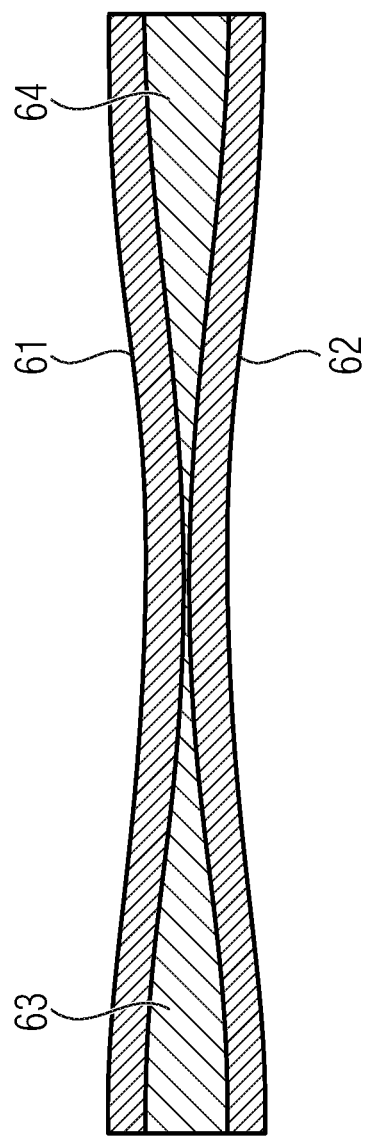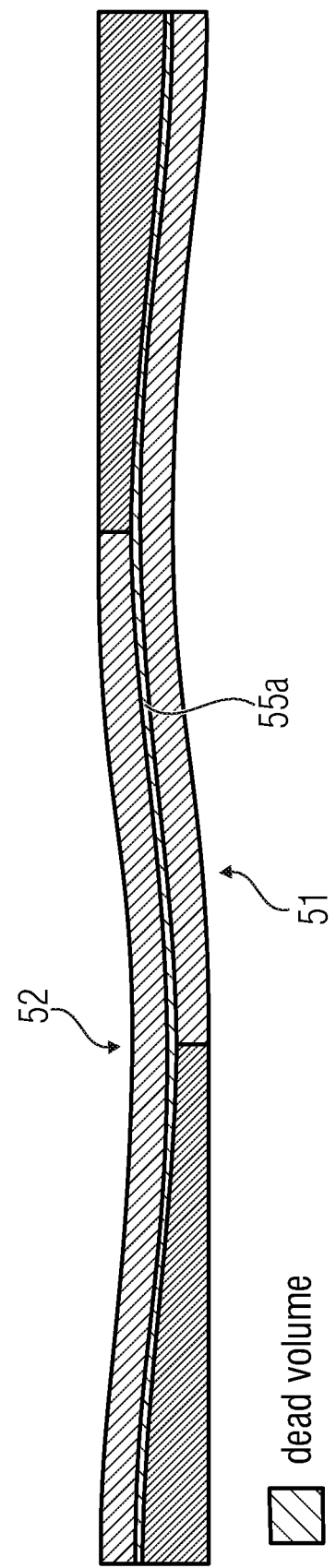
Fig. 6a
Fig. 6b

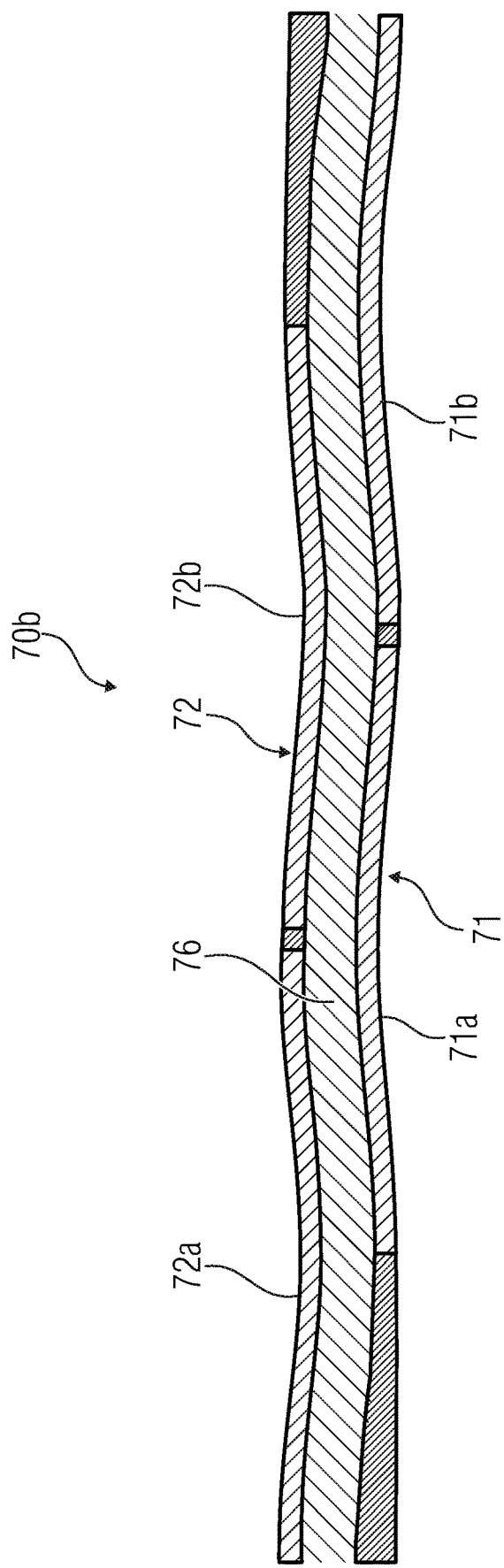
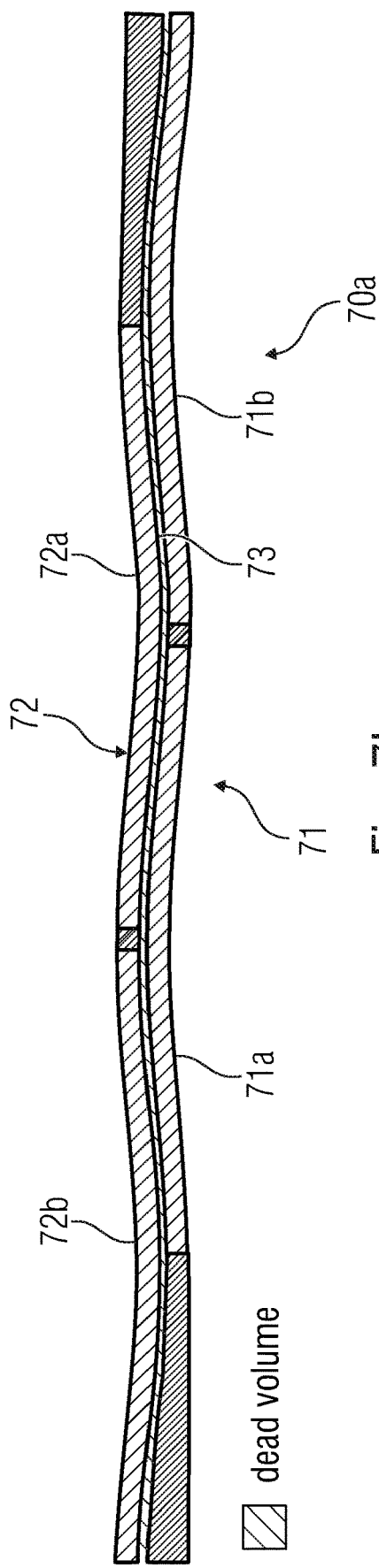
Fig. 7a
Fig. 7b

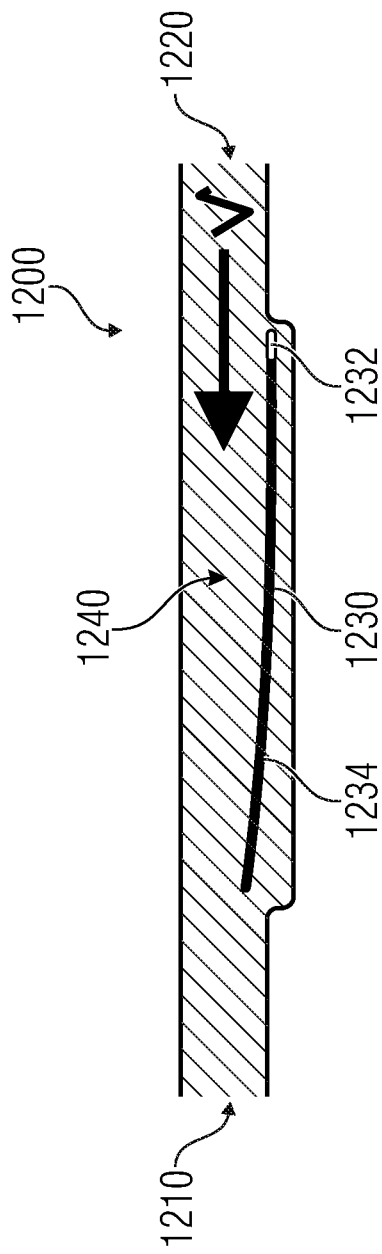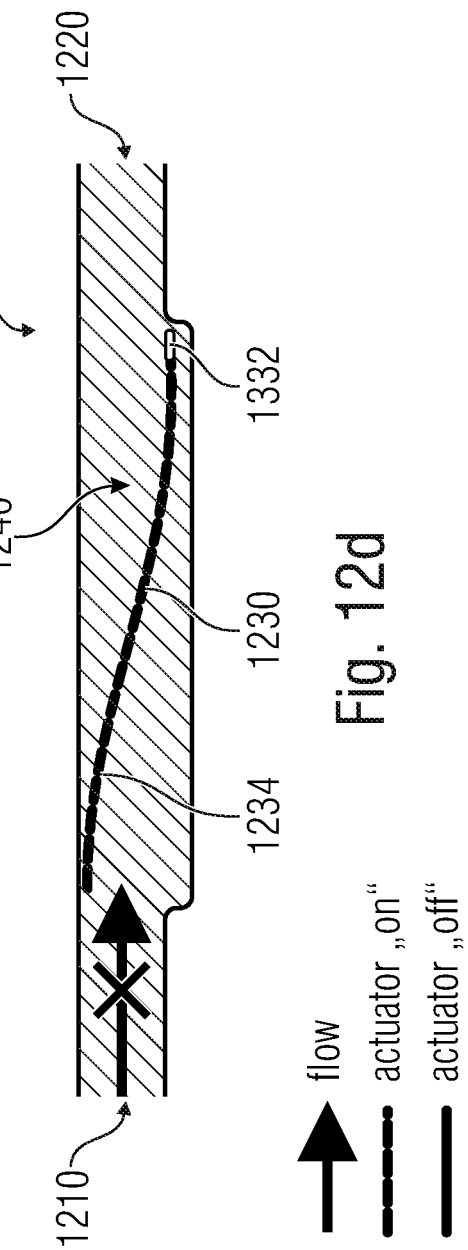

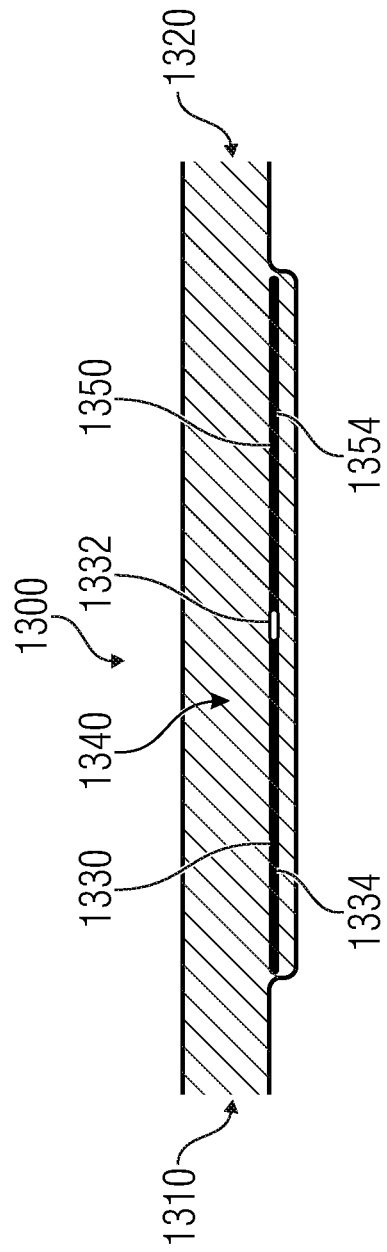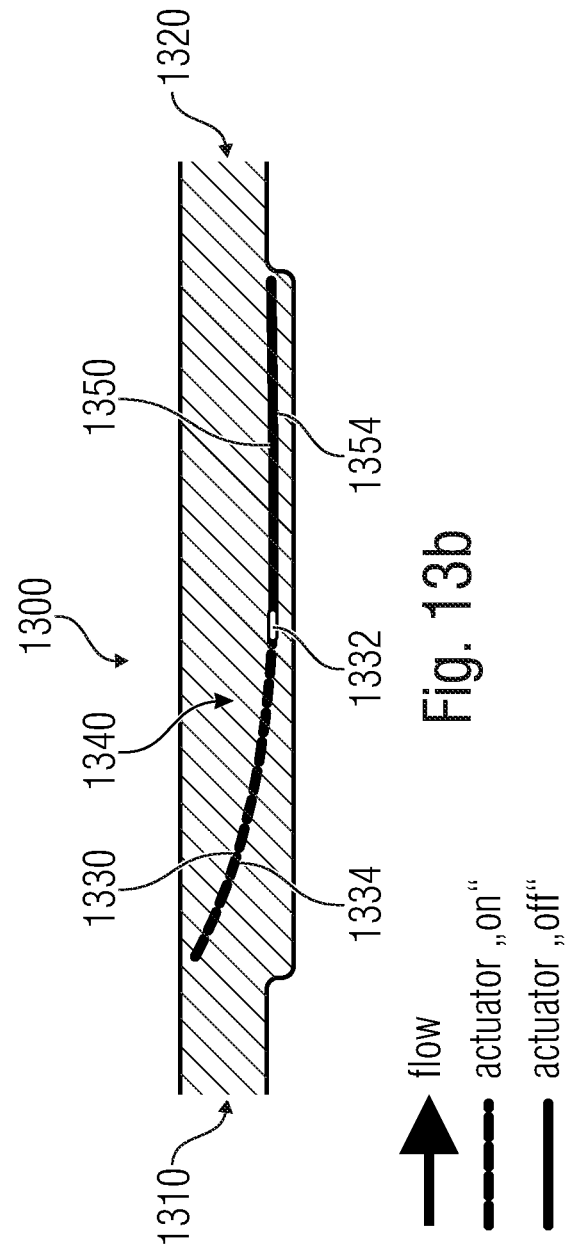

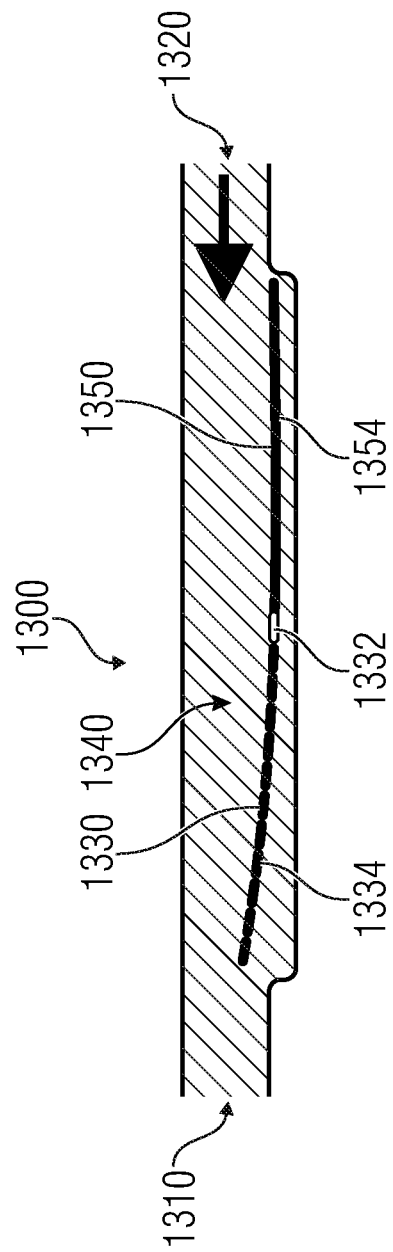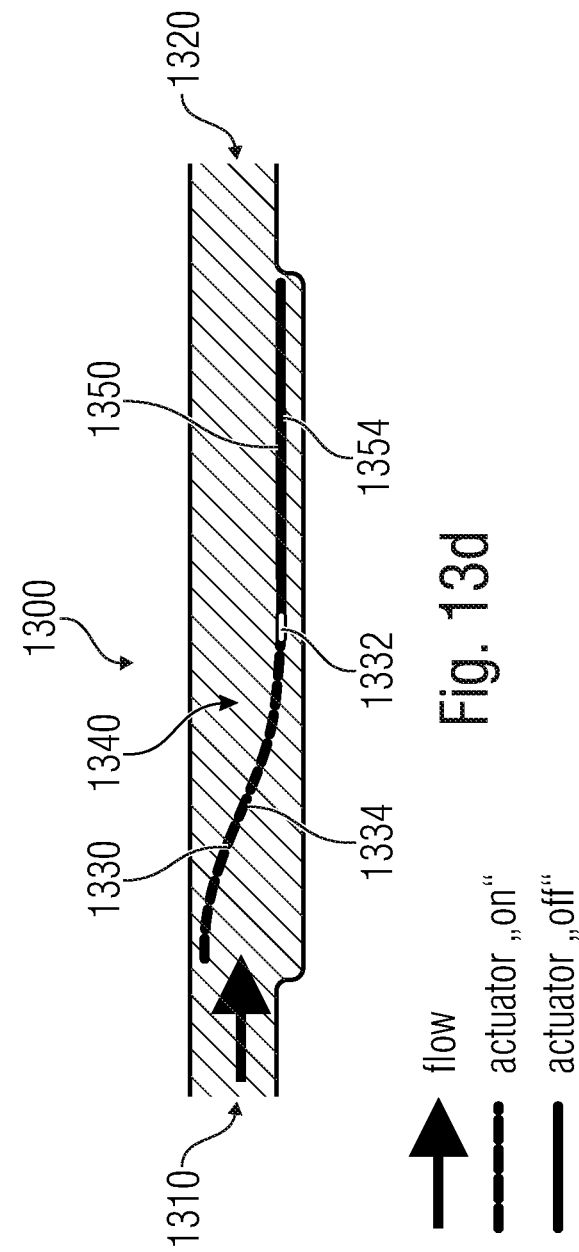

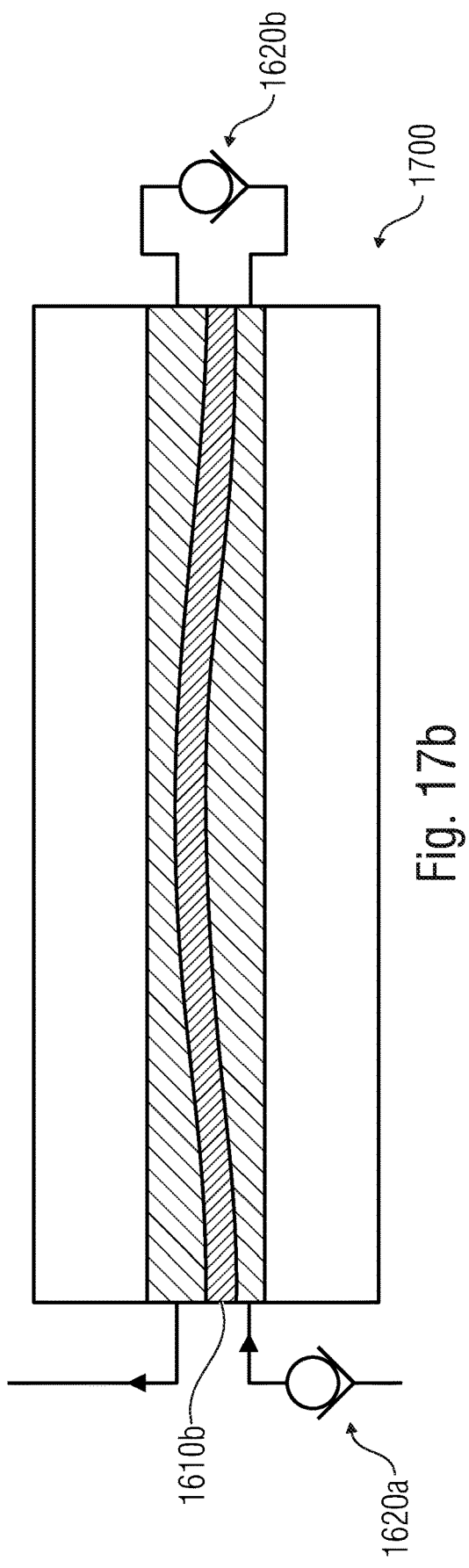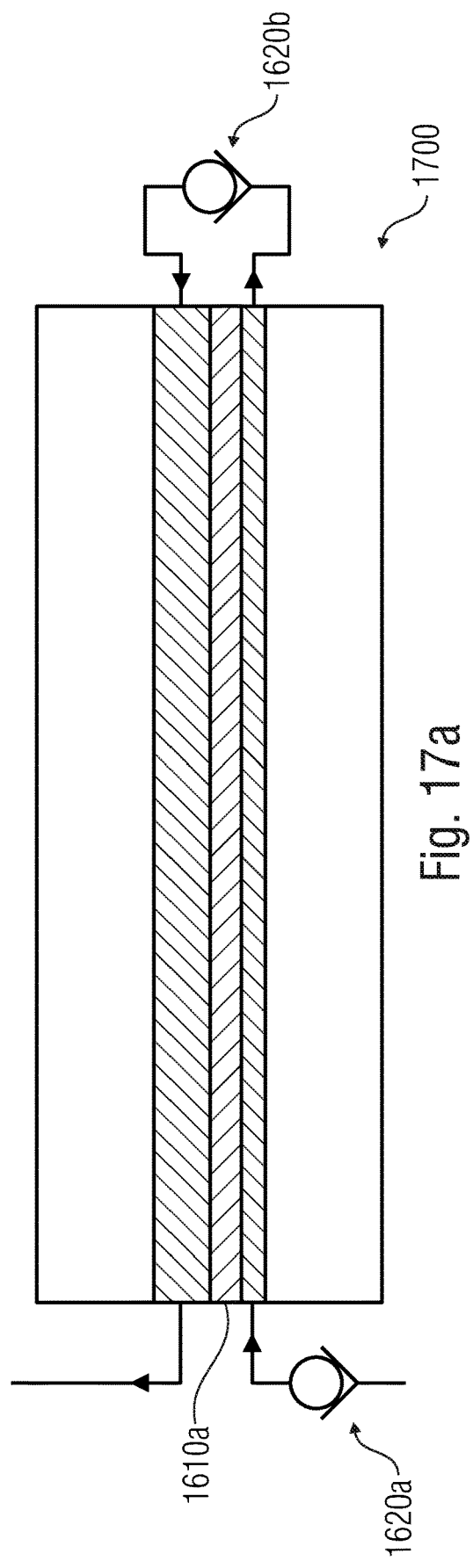

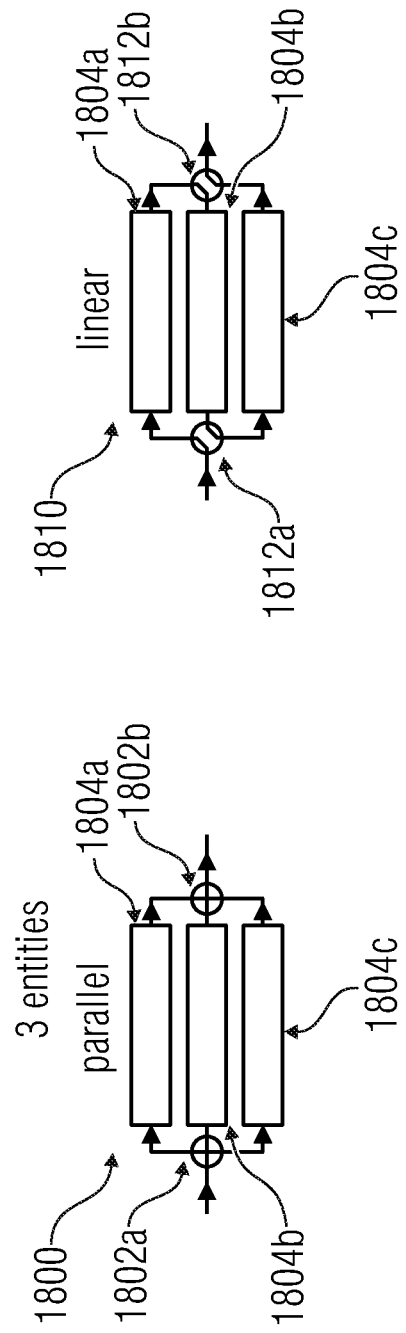

valves may be passive due to reverse flow, valve must be passive!

MICROMECHANICAL DEVICES WITH MECHANICAL ACTUATORS

CROSS-REFERENCES TO RELATED APPLICATION

This application is a continuation of copending International Application No. PCT/EP2018/050469, filed Jan. 9, 2018, which is incorporated herein by reference in its entirety, and additionally claims priority from German Application Nos. DE 10 2017 200 308.1, filed Jan. 10, 2017, which is incorporated herein by reference in its entirety.

BACKGROUND OF THE INVENTION

The present invention relates to micromechanical devices with mechanical actuators for use for, for example, fluidic tasks.

Micromechanical fluidic devices used for example in inkjet printheads enable miniaturization of fluidic components. Miniaturization is a strong driving factor in nowadays industrial production as the use of smaller structures enables a saving of raw materials. However, micromechanical fluidic components may for example suffer from small flow-rates or pressure when compared to non-miniaturized counterparts. Moreover, manufacturing of micromechanical devices based on piezo technology is tedious and problematic. Nano electric drives (NEDs) are known but improvements are desirable.

Independent from an actuation mechanism a desire for efficient pumping or valve solutions exists. Alternatively, a desire exists for concepts providing efficient micromechanical components for, for example, fluidic tasks.

SUMMARY

According to an embodiment, a planar micromechanical actuator suspended on opposing suspension zones may have: a neutral axis between the opposing suspension zones, first to fourth segments into which the planar micromechanical actuator is segmented between the opposing suspension zones, each having a first electrode and a second electrode which form a capacitor and are isolatedly affixed to each other at opposite ends of the respective segment along a direction between the opposing suspension zones so as to form a gap between the first and second electrode along a thickness direction, the gap being offset to the neutral axis along the thickness direction, and wherein the first to fourth segments are configured such that the planar micromechanical actuator deflects into the thickness direction by the first and fourth segment bending into the thickness direction and the second and third segments bending contrary to the thickness direction upon a voltage being applied to the first and second electrodes of the first to fourth segments.

According to another embodiment, a planar micromechanical actuator suspended on opposing suspension zones may have: a first, second and third electrode, wherein the second electrode is sandwiched between the first and third electrodes, wherein the planar micromechanical actuator is segmented between the opposing suspension zones into a sequence of segments, wherein for each segment the first electrode and third electrode are isolatedly affixed to the second electrode at opposite ends of the respective segment along a direction between the opposing suspension zones, wherein the sequence of segments is subdivided into a first to fourth subsequence of segments, each subsequence having one or more segments, wherein in each segment of the first and fourth subsequences, the first, second and third electrodes are shaped to bulge towards a first direction and bend upon application of a voltage between the first and third electrodes on the one hand and the second electrode on the other hand into a second direction opposite to the first direction, and wherein in each segment of the second and third subsequences, the first, second and third electrodes are shaped to bulge towards the second direction and bend upon application of the voltage between the first and third electrodes on the one hand and the second electrode on the other hand into the first direction, wherein the first subsequence of segments, second subsequence of segments, third subsequence of segments and fourth subsequence of segments each cover a fourth of a distance between the opposing suspension zones.

According to another embodiment, a micromechanical pump may have a first planar actuator suspended on opposite ends and composed of one or more first deflective portions, a second planar actuator suspended on opposite ends and composed of one or more second deflective portions, a third planar actuator suspended on opposite ends and composed of one or more third deflective portions, wherein the second planar actuator is arranged in between the first and the third planar actuator and the first and the second planar actuator are arranged along each other so as to form a first fluid passage therebetween, and the third and the second planar actuator are arranged along each other so as to form a second fluid passage therebetween, wherein the one or more second deflective portions are shifted relative to the one or more first and third deflective portions along a direction between the opposite ends of the first to third planar actuators such that a center of the one or more second deflective portions is aligned with a suspension zone of the one or more first and third deflective portions, and wherein the first, second and third planar actuator are configured to change the first and second fluid passages' volumes oppositely by deflection of the first to third deflective portions.

According to another embodiment, a micromechanical actuator arrangement having a stack of planar micromechanical actuators may have a first planar micromechanical actuator having a first planar micromechanical actuator segment with a surface having a first curvature, and a second planar micromechanical actuator having a second planar micromechanical actuator segment with a surface having a second curvature, wherein the first curvature forms a recess in the first planar micromechanical actuator segment and the second curvature forms a protrusion of the second planar micromechanical actuator segment, and wherein the surface of the first micromechanical planar actuator segment having the first curvature faces the surface of the second micromechanical planar actuator segment having the second curvature, and wherein the first curvature has a greater radius than the second curvature, so that a distance between the surface of the first micromechanical planar actuator segment and the surface of the second micromechanical planar actuator segment is substantially laterally constant and is retained when deflecting the first planar micromechanical actuator segment and the second planar micromechanical actuator segment.

According to another embodiment, a micromechanical valve may have a first fluid port, a second fluid port, a micromechanical actuator, and a fluid passage formed between the first fluid port and the second fluid port, the fluid passage having two opposite and parallel wall portions, wherein the micromechanical actuator is arranged in the fluid passage, and wherein the micromechanical actuator is configured to deflect in a plane parallel to the two parallel wall portions based on an activation signal provided to same such that the fluid passage between the first fluid port and the second fluid port is at least partially blocked by the micromechanical actuator.

According to another embodiment, a micromechanical pump may have a first planar actuator suspended on opposite ends and composed of one or more first deflective portions, a second planar actuator suspended on opposite ends and composed of one or more second deflective portions, wherein the first planar actuator and the second planar actuator are arranged along each other with forming a fluid passage therebetween, wherein the first planar actuator and the second planar actuator are configured so that the one or more first deflective portions and second deflective portions deflect away from each other upon actuation of the first planar actuator and the second planar actuator, wherein a center of the first deflective portions is not aligned with a center of the second deflective portions along a direction between the opposite ends, and/or wherein the fluid passage between the first planar actuator and the second planar actuator is fluidicaly connected via valves with fluid volumes adjacent to sides of the first planar actuator and second planar actuator facing away from the fluid passage.

In accordance with a first aspect of the present application, a planar micromechanical actuator suspended on opposing suspension zones is provided. The planar micromechanical actuator comprises a neutral axis between the opposing suspension zones. Furthermore, the planar micromechanical actuator comprises first to fourth segments into which the planar micromechanical actuator is segmented between the opposing suspension zones. Each of the first to fourth segments comprises a first electrode and a second electrode which form a capacitor and are isolately affixed to each other at each end of the respective segment along a direction between the opposing suspension zones so as to form a gap between the first and second electrode along a thickness direction. The gap is offset to the neutral axis along a thickness direction. Moreover, the first to fourth segments are configured such that the planar micromechanical actuator deflects into the thickness direction by the first and fourth segment bending into the thickness direction and the second and third segments bending contrary to the thickness direction upon a voltage being applied to the first and second electrodes of the first to fourth segments. Composing the micromechanical actuator in such a manner on the basis of a sequence of four segments with changing bending direction between the first and second and third and fourth segment, respectively, results in improved pressure per surface.

Applying said voltage to the first and second electrodes induces charges on the first and second electrode. According to Coulomb's law, charges with opposing signs create an attractive force between said charged electrodes and like signed charges produce a repulsive force on said electrodes. The described forces can be used to enable a deflection of the planar micromechanical actuator into or contrary to the thickness direction based on the applied voltage. Moreover, the segments are ordered according to their numbering between the opposing suspension zones and through their bending configuration enable to recover the curvature upon actuation. The recovery of the curvature enables the opposing suspension zones to be on equal level, i.e. the suspended ends of the first and fourth segment may remain in unchanged positions in a non-actuated state and in an actuated state, wherein an actuated state is caused by applying a voltage to the first and second electrode of the first to fourth segments. The described planar micromechanical actuator may be used, for example for pumping fluids. In particular, the planar micromechanical actuator enables high frequency actuation and provides a high pressure.

In accordance with a second aspect of the present application, a planar micromechanical actuator suspended on opposing suspension zones is implemented comprising a first, second and third electrode, wherein the second electrode is sandwiched between the first and third electrodes. Moreover, the planar micromechanical actuator is segmented between the opposing suspension zones into a sequence of segments, wherein for each segment the first electrode and third electrode are isolatedly affixed to the second electrode at opposite ends of the respective segment along a direction between the opposing suspension zones. The sequence of segments is subdivided into a first to fourth subsequence of segments, wherein each subsequence comprises one or more segments. In each segment of the first and fourth subsequences, the first, second and third electrodes are shaped to bulge towards a first direction and bent upon application of a voltage between the first and third electrodes on the one hand and the second electrode on the other hand into a second direction opposite to the first direction. In each segment of the second and third subsequences, the first, second and third electrodes are shaped to bulge towards the second direction and bent upon application of a voltage between the first and third electrodes on the one hand and the second electrode on the other hand into the first direction. Furthermore, the first subsequence of segments, second subsequence of segments, third subsequence of segments and fourth subsequence of segments each cover a fourth of a distance between the opposing suspension zones.

The described planar micromechanical actuator is particularly advantageous as the bulged shape of the segments enables that a bending action provided by the pair of first and second electrodes and a bending action provided by the pair of second and third electrode may add up so as to result in a particularly effective actuation of the segments. Moreover, using a design based on three electrodes may enable a more homogeneous distribution of force acting in the actuator. Furthermore, using subsequences of segments may enable a flexible layout in terms of maximum stroke that can be produced by the planar micromechanical actuator. In other words, using longer subsequences may lead to planar micromechanical actuators with a bigger stroke and hence a bigger volume that can be moved during an actuation.

In accordance to a third aspect of the present application, a micromechanical pump is implemented. The micromechanical pump comprises a first planar actuator suspended on opposite ends and composed of one or more first deflective portions, a second planar actuator suspended on opposite ends and composed of one or more second deflective portions and a third planar actuator suspended on opposite ends and composed of one or more third deflective portions. Moreover, the second planar actuator is arranged between the first and the third planar actuator and the first and the second planar actuators are arranged along each other so as to form a first fluid passage therebetween. Moreover, the third and the second planar actuators are arranged along each other so as to form a second fluid passage therebetween. The one or more second deflective portions are shifted relative to the one or more third deflective portions along a direction between the opposite ends of the first to third planar actuators such that a center of the one or more second deflective portions is aligned with a suspension zone of the one or more first and third deflective portions. Furthermore, the first, second and third planar actuators are configured to change the first and second fluid passages volumes oppositely by deflection of the first and third deflective portions.

The described micromechanical pump can for example be effectively integrated into miniaturized fluidic apparatuses. For example, the planar actuators may be wall portions of the fluid passages. Upon actuation, the volume of the fluid passages is changed and thereby a fluid flow may be caused. Moreover, the described micromechanical pump may allow through the shifted arrangement of the deflective portions a small footprint in terms of used area. Alternatively, the shifted arrangement achieves an efficient usage of the area such that the pumping power is increased for a given area.

In accordance with a fourth aspect of the present application, a micromechanical actuator arrangement comprising a stack of planar micromechanical actuators is implemented. The micromechanical actuator arrangement comprises a first planar micromechanical actuator comprising a first planar micromechanical actuator segment with a surface having a first curvature and a second planar micromechanical actuator comprising a second planar micromechanical actuator segment with a surface having a second curvature. The first curvature forms a recess in the first planar micromechanical actuator segment and the second curvature forms a protrusion of the second planar micromechanical actuator segment. Moreover, the surface of the first micromechanical planar actuator segment having the first curvature faces the surface of the second micromechanical planar actuator segment having the second curvature. Furthermore, the first curvature has a greater radius than the second curvature, so that a distance between the surface of the first micromechanical planar actuator segment and the surface of a second micromechanical planar actuator segment is substantially laterally constant and is retained when deflecting the first planar micromechanical actuator segment and the second planar micromechanical actuator segment.

The described micromechanical actuator arrangement may enable a high density integration, i.e. miniaturization by efficient usage of space, as the first planar micromechanical actuator and the second planar micromechanical actuator may be stacked with minimal distance. The minimal distance may be achieved through the conforming curvatures of the recess and the protrusion of the respective segments which upon actuation of the actuators are configured to retain a minimum distance. Such a stack may be regarded as a parallel arrangement, achieving a doubling of a produced pressure upon actuation when compared to using only a single planar micromechanical actuator, for example.

In accordance with a fifth aspect of the present application, a micromechanical valve is implemented. The micromechanical valve comprises a first fluid port, a second fluid port, a micromechanical actuator and a fluid passage formed between the first fluid port and the second fluid port, wherein the fluid passage has two opposite and parallel wall portions. Furthermore, the micromechanical actuator is arranged in the fluid passage and configured to deflect in a plane parallel to the two parallel wall portions based on an activation signal provided to same such that the fluid passage between the first fluid port and the second fluid port is at least partially blocked by the micromechanical actuator.

The described valve is advantageous as may allow a space-saving implementation of a valve. The valve may be implemented without the need of additional space when compared to implementing a simple fluid passage. Moreover, a valve can be used as an active check valve which compared to a passive check valve reduces a pressure drop incurred on a fluid passing through the valve. Therefore, the described micromechanical valve enables implementation of miniaturized active check valves.

In accordance to a sixth aspect of the present application, a micromechanical pump is implemented. The micromechanical pump comprises a first planar actuator suspended on opposite ends and composed of one or more first deflective portions and a second planar actuator suspended on opposite ends and composed of one or more second deflective portions. Moreover, the first planar actuator and the second planar actuator are arranged along each other with forming a fluid passage therebetween, wherein the first planar actuator and the second planar actuator are configured so that the one or more first deflective portions and second deflective portions deflect away from each other upon actuation of the first planar actuator and the second planar actuator. A center of the first deflective portions is not aligned with a center of the second deflective portions along a direction between the opposite ends and/or wherein the fluid passage between the first planar actuator and the second planar actuator is fluidicaly connected via valves with fluid volumes adjacent to sides of the first planar actuator and second planar actuator facing away from the fluid passage.

The described micromechanical pump is beneficial in terms of reduced hydraulic resistance. As two planar micromechanical actuators are deflecting to increase a volume of the fluid passage, the hydraulic resistance is reduced compared to a case where only one micromechanical actuator is deflecting. The case of only one micromechanical actuator suffers from one inactive wall of a the fluid passage. Moreover, the pump comprising two planar micromechanical actuators may pump as much volume as a two pumps each with one planar micromechanical actuator. However, due to an increased fluid passage width of the described micromechanical pump an hydraulic resistance may only be a fourth of that of two pumps.

In embodiments according to the first aspect, the planar micromechanical actuator comprises exactly the four segments. Implementing the planar micromechanical actuator with only four segments results in a shortest possible actuator configuration. Related to the small length is a high actuation frequency, i.e. the actuator can move fast from an actuated to a non-actuated state. Each change of state may imply a certain stroke being applied on a volume, i.e. a fluid, and thereby causing a volume transport. Through the described fast actuation a high flow rate may be achieved comparable to or even bigger than actuators having bigger stroke but lower actuation frequency.

In embodiments according to the first aspect, the gaps of the first and fourth segment are arranged on a first side of the neutral axis and the gaps of the second and third segment are arranged on a second side of the neutral axis. Moreover, the second side opposes the first side, i.e. the neutral axis divides the first and second side. Arranging the gaps in the described manner enables recovery of a curvature of the planar micromechanical actuator. In other words the opposing suspension zones may remain unaltered in an actuated and in an non-actuated state.

In embodiments according to the first aspect, the first and second electrodes of the respective segments are isolatedly affixed to each other by spacers. Using affixitation by spacers enables a more flexible design of the electrodes, e.g. an entirely planar shape may be used for the electrodes as the affixitation between the electrodes may not be realized as part of the electrodes.

In embodiments according to the first aspect, the spacers are formed, at least partially, from an insulating material.

Using spacers with insulating material enables electric insulation of the first and second electrode through the spacers thereby saving for example an insulation employed on the electrodes directly.

In embodiments according to the first aspect, the gaps of the respective segments, neglecting the affixitation, are of planar shape. The planar shape of the gaps may be defined by a substantially constant distance between the opposing electrodes such that the electrodes are arranged in parallel. Moreover, the gaps may be formed conformal. The planar shape of the gaps offers a space saving design beneficial for an integrated implementation of the planar micromechanical actuator.

In embodiments according to the first aspect, each segment comprises a third electrode arranged along the second electrode on an opposite side of the neutral axis to the first electrode. Furthermore, for each segment the third electrode is isolatedly affixed to the second electrode at opposite ends of the respective segment along a direction between the opposing suspension zones so as to form a second gap in a direction opposite to the thickness direction. Implementing the segments with a third electrode enables a more homogenous force distribution upon actuation of the planar micromechanical actuator inside the planar micromechanical actuator.

In embodiments according to the second aspect, each subsequence of segments comprises an identical number of segments. Using subsequences with identical number of segments allows for a better recovery of the curvature and a homogenous distribution of stroke produced by the planar micromechanical actuator between the opposing suspension zones.

In embodiments according to the second aspect, the planar micromechanical actuator comprises a neutral axis formed in the second electrode between the opposing suspension zones. Having a neutral axis inside the second electrode provides a section of the planar micromechanical actuator which is not altered in length and, thereby, is not subjected to any force acting on it.

In embodiments according to the second aspect, each subsequence forming the sequence of segments comprises exactly one segment. Implementing the planar micromechanical actuator with said subsequences provides a planar micromechanical actuator with minimum length. From the minimum length a maximum actuation frequency is obtained and, thereby, a high flow rate can be achieved with the described embodiment.

In embodiments according to the second aspect, the first and second electrode are affixed to each other by first spacers and the second and third electrode are affixed to each other by second spacers. Using an affixitation by spacers enables saving of implementing the affixitation directly on the electrodes, allowing a more flexible shape of the electrodes.

In embodiments according to the second aspect, the first electrode has a greater thickness than the third electrode in the first and fourth subsequence of the sequence of segments. Moreover, the first electrode has a smaller thickness than the third electrode in the second and third subsequence of the sequence of segments. The described thickness variation of the electrodes for example enables a saving of space used for the overall planar micromechanical actuator in the subsequences where the electrodes are thin. Moreover, it may enable a structural benefit, i.e. result in a robust actuator structure, while still saving material in sections where lower structural robustness is needed.

In embodiments according to the second aspect, the first and second electrode are affixed to each other by first spacers and the second and third electrode are affixed to each other by second spacers. Moreover, the first and second spacers and the second electrode at the first and second spacers are formed such that an overall thickness of the planar micromechanical actuator remains constant on borders between the subsequences of segments. For example the first spacers compensate for a transition of thickness of the first electrode from the first subsequence to the second subsequence. Therefore, the first spacers may be shaped such that they may have an increasing slope from the first subsequence to the second subsequence to account for a decreasing thickness of the first electrode from the first subsequence to the second subsequence. Moreover, for example the second spacers may have a decreasing thickness from the first subsequence to the second subsequence to account for an increasing thickness of the third electrode from the first subsequence to the second subsequence.

In embodiments according to the second aspect, gaps formed between the first and second electrode and the first spacers are arc shaped and gaps formed between the second and third electrode and the second spacers are arc shaped. Arc shaped gapes are due to a beneficial segment layout wherein the segments have protrusions and recesses facing each other.

In embodiments according to the second aspect, the spacers are formed, at least partially, from an insulating material. Using spacers formed, at least partially, from an insulating material for example saves implementing an insulation on or in the individual electrodes on the affixitations.

In embodiments according to the second aspect, in each segment of the first and fourth subsequences, an outer surface of the first electrode has a first curvature forming a protrusion of the planar micromechanical actuator in the respective segment. Moreover, an outer surface of the third electrode directed oppositely to the outer surface of the first electrode has a second curvature forming a recess of the planar micromechanical actuator. Furthermore, the first curvature has a smaller radius than the second curvature. The described embodiments enables implementation of the first and fourth subsequences with segments wherein the electrodes are arranged closely to each other, e.g. with minimum distance enabling a space and material saving. Wherein said minimum distance is characterized by inhibition of contact of the individual electrodes upon actuation.

In embodiments according to the second aspect, in each segment of the second and third subsequences, an outer surface of the first electrode has a first curvature forming a recess of the planar micromechanical actuator in the respective segment. Moreover, an outer surface of the third electrode directed oppositely to the outer surface of the first electrode has a second curvature forming a protrusion of the planar micromechanical actuator. Furthermore, the first curvature has a greater radius than the second curvature. The described embodiments enables implementation of the second and third subsequences with segments wherein the electrodes are arranged closely to each other, e.g. with minimum distance enabling a space and material saving. Wherein said minimum distance is characterized by inhibition of contact of the individual electrodes upon actuation.

In embodiments according to the third aspect, the micromechanical pump comprises a first check valve arranged at a first port of the first fluid passage to guide a fluid flow into or from the first fluid passage. The described embodiment is beneficial in that it avoids a backflow of the fluid from or to the first fluid passage through the first check valve. This is facilitated by the first check valve which only allows a unidirectional fluid flow. Moreover, the first check valve may be reconfigurable to enable a change of fluid flow direction.

In embodiments according to the third aspect, the micromechanical pump comprises a second check valve connecting the first and the second fluid passage and is arranged between a second port of the first fluid passage and a first port of the second fluid passage. Furthermore, the second check valve is configured to guide a fluid flow from the first fluid passage into the second fluid passage. The described embodiment advantageously denies or reduces a backflow of a fluid from the second fluid passage to the first fluid passage as the second check valve forces a unidirectional flow of the fluid. Moreover, the second check valve may be reconfigurable to enable a change of fluid flow direction.

In embodiments according to the third aspect, the micromechanical pump comprises a third check valve arranged at a second port of the second fluid passage to guide a fluid flow into or from the second fluid passage. The described embodiment advantageously denies or reduces a backflow of a fluid from or to the second fluid passage as the third check valve forces a unidirectional flow of the fluid. Moreover, the third check valve may be reconfigurable to enable a change of fluid flow direction.

In embodiments according to the third aspect, the first planar actuator is suspended on one end along the first fluid passage on a first suspender. Moreover, the first suspender is configured to conform to a deflective portion of the one or more second deflective portions of the second planar actuator upon deflection of the deflective portion of the one or more second deflective portions. Using said first suspender reduces dead volume upon actuation, i.e. if the actuators are arranged sufficiently close to each other more volume in the first fluid passage may be transported out of the fluid passage and less or none may remain inside the first fluid passage.

In embodiments according to the third aspect, the second planar actuator is suspended on one end along the first fluid passage on a second suspender. Moreover, the second suspender is configured to conform to a deflective portion of the one or more first deflective portions of the first planar actuator upon actuation of the deflective portion of the one or more first deflective portions of the first planar actuator. Using said second suspender reduces dead volume upon actuation, i.e. if the actuators are arranged sufficiently close to each other more volume in the first fluid passage may be transported out of the fluid passage and less or none may remain inside the first fluid passage.

In embodiments according to the third aspect, the third planar actuator is suspended on one end along the second fluid passage on a third suspender. Furthermore, the third suspender is of same shape as the first suspender. Using said third suspender makes fluid transport through an optional third fluid passage (along the third planar actuator, on an opposite side of the second fluid passage) more effective, as less volume may remain in the optional third fluid passage upon actuation of an optional fourth planar actuator (arranged along the third planar actuator).

In embodiments according to the third aspect, the micromechanical pump is configured to deflect the deflective portions of the planar actuators sequentially. The sequential deflection is configured to create a peristaltic movement. In other words, the deflective portions of opposing planar actuators are actuated sequentially along a pumping direction so that a fluid is squeezed out of a fluid passage in between the opposing planar actuators. The described peristaltic movement reduces backflow inside a fluid passage and, therefore, enables an efficient fluid transport.

In embodiments according to the fourth aspect, each planar micromechanical actuator segment comprises a layer stack composed of a first, second and third electrode, wherein the second electrode is sandwiched between the first and the third electrode. Moreover, the surface having the first curvature of the first planar micromechanical actuator segment is formed by the third electrode of the first planar micromechanical actuator segment and the surface having the second curvature of the second planar micromechanical actuator segment is formed by the first electrode of the second planar micromechanical actuator segment. Using the described micromechanical actuator segment layout enables implementation of a more robust micromechanical actuator arrangement.

In embodiments according to the fourth aspect, the first and the second planar micromechanical actuator comprises sequences of planar micromechanical actuator segments. By lateral concatenation of segments perpendicular to a deflection direction said sequences may be obtained. A sequence of segments may beneficially be used to produce a greater stroke than a single segment.

In embodiments according to the fourth aspect, the first and the second planar micromechanical actuators are suspended between opposing suspension zones. Suspending the micromechanical actuator arrangement on opposing suspension zones can be used to integrate said micromechanical actuator arrangement for example in a wafer.

In embodiments according to the fifth aspect, the micromechanical actuator has a closed contour and the closed contour of the micromechanical actuator is configured to modulate its shape upon actuation of the micromechanical actuator. The closed contour may be formed based on micromechanical actuators as described with respect to one of the aforementioned aspects of the present application. The described micromechanical actuator having said contour can beneficially be used to flexibly regulate a fluid flow gradually by gradually changing the shape of the closed contour based on an activation signal.

In embodiments according to the fifth aspect, the closed contour of the micromechanical actuator is of circular shape when not being actuated. Furthermore, the closed contour of the micromechanical actuator is configured to be of elliptical shape upon being actuated. Using said micromechanical actuator allows a particularly beneficial gradual flow control. An elliptical shape may have focuses lying far apart which may be used to produce a large flow reduction if the focuses of the ellipses are lying in a line perpendicular to a flow direction.

In embodiments according to the fifth aspect, the close contour of the micromechanical actuator is affixed to at least one of the two parallel wall portions at a point of the closed contour. Using said affixitation enables a simple mounting of the micromechanical actuator in a path of a fluid flow.

In embodiments according to the fifth aspect, the closed contour of the micromechanical actuator is affixed by at least two springs to at least one of the two parallel wall portions. Moreover, the springs are affixed at one end at substantially opposite points of the close contour of the micromechanical actuator and with another end affixed to points or a point on at least one of the two parallel wall portions located within the closed contour. The described affixitation by springs enables a flexible attachment such that the micromechanical actuator is easily able to change its contour upon actuation.

In embodiments according to the fifth aspect, the micromechanical actuator is planar and configured to deflect, upon activation, along a lateral direction between a suspension zone at which the micromechanical actuator is suspended and a unsuspended end of the micromechanical actuator. Furthermore, the micromechanical actuator is arranged at a wall of the fluid passage connection the two parallel wall portions when not being activated and the micromechanical actuator moves the unsuspended end into the fluid passage upon activation. The described embodiment enables implementation of a cheap and cost effective valve as the micromechanical actuator may be formed using a small amount of segments, in other words a small amount of material.

In embodiments according to the fifth aspect, the micromechanical actuator is configured to enable a fluid flow in a direction along the suspended end of the mechanical actuator to the unsuspended end of the micromechanical actuator and avoiding a fluid flow in a direction along the unsuspended end to the suspended end of the micromechanical actuator upon deflection of the micromechanical actuator. The described embodiment implements an check valve which can be advantageously used to guide a fluid flow only in one direction.

In embodiments according to the fifth aspect, the micromechanical valve comprises a further micromechanical actuator which is planar and configured to deflect, upon activation, along a lateral direction between a further suspension zone at which the further micromechanical actuator is suspended and a further unsuspended end of the further micromechanical actuator. Furthermore, the micromechanical actuator is arranged at the wall of the fluid passage connecting the opposite parallel wall portions when not being activated and the further micromechanical actuator moves the further unsuspended end into the fluid passage upon activation. Moreover, when seen along a predetermined direction within the fluid passage, the unsuspended end precedes the suspension zone and the further suspension zone precedes the further unsuspended end. The micromechanical actuator may share their suspensions zones, so that both a suspended on a common suspension zone. The described embodiment enables an efficient and flexible implementation of a check valve and a flow rate control.

In embodiments according to the fifth aspect, the micromechanical valve is configured to enable a fluid flow in a direction from the further unsuspended end to the unsuspended end and to avoid a fluid flow in a direction from the unsuspended end to the further unsuspended end upon deflection of the unsuspended end of the micromechanical actuator. The described embodiment efficiently enables implementation of a check valve such that the valve may change its usage from flow rate control to flow direction control.

In embodiments according to the fifth aspect, the micromechanical valve is configured to enable a fluid flow in a direction along the unsuspended end to the further unsuspended end and to avoid a fluid flow in a direction along the further unsuspended end to the unsuspended end upon deflection of the further unsuspended end of the further micromechanical actuator. The described embodiment efficiently enables implementation of a bidirectional check valve and flow control such that the valve may change the flow direction during usage. Furthermore, it may advantageously provide means for a flow rate control.

In embodiments according to the fifth aspect, the micromechanical valve comprises a third and a fourth fluid port forming a crossing with the first and second fluid port. Moreover, the micromechanical actuator is planar and comprises two deflectable portions. The micromechanical actuator is affixed between the two deflectable portions to at least one of the two parallel wall portions in the crossing. Furthermore, the micromechanical actuator is configured to enable a fluid flow between on one hand the first fluid port and on the other hand the second, third and fourth fluid ports, in a non-actuated state. Moreover, the micromechanical actuator is configured to enable a fluid flow only between the first fluid port and the third fluid port and only between the second fluid port and the fourth fluid port upon actuation of the micromechanical actuator, i.e. in an actuated state. The described embodiment provides a flexible structure enabling a switching from cross structure to a split structure. In other words, a fluid flow may be distributed or guided in a flexible way.

In embodiments according to the fifth aspect, the micromechanical valve comprises a third and a fourth fluid port forming a crossing with the first and the second fluid port. Furthermore, the micromechanical actuator is bent and comprises two deflectable portions, wherein the micromechanical actuator is affixed between the two deflectable portions to at least one of the two parallel wall portions in the crossing. Moreover, the micromechanical actuator is configured to enable a fluid flow only between the first fluid port and the third fluid port and only between the second fluid port and the fourth fluid port, in an non-actuated state or position. Furthermore, the micromechanical actuator is configured to enable a fluid flow between on one hand the first fluid port and on the other hand the second, third and fourth fluid ports, in a first actuation state or a first actuated state. Moreover, the micromechanical actuator is configured to enable a fluid flow only between the first fluid port and the fourth fluid port and only between the second fluid port and the third fluid port, in a second actuation state or in a second actuated state. The described embodiment enables a flexible split/cross configurable valve. In other words, fluid flows may be routed particularly flexible to desired ports.

In embodiments according to the fifth aspect, the micromechanical valve comprises a third and a fourth fluid port forming a crossing with the first and second fluid port, wherein the micromechanical actuator has a closed contour and is arranged in the crossing. Furthermore, the micromechanical actuator is configured to enable a fluid flow between on one hand the first fluid port and on the other hand the second, third and fourth fluid ports, in an non-actuated state or position. Moreover, the micromechanical actuator is configured to enable a fluid flow only between the first fluid port and the third fluid port and only between the second fluid port and the fourth fluid port, in a first actuation state or a first actuated state. Furthermore, the micromechanical actuator is configured to enable a fluid flow only between the first fluid port and the fourth fluid port and only between the second fluid port and the third fluid port, in a second actuation state or a second actuated state. The closed contour may be formed based on micromechanical actuators as described with respect to one of the aforementioned aspects of the present application. The described embodiment enables a flexible split/cross configurable valve. In other words, fluid flows may be routed particularly flexible to desired ports. Moreover, a flow rate control may be achieved with the described embodiment as dependent on the shape of the closed contour individual fluid paths can be enlarged or reduced.

In embodiments according to the fifth aspect, the micromechanical actuation is affixed by at least two springs, wherein the springs are on one end attached on substantially opposite ends of the closed contour of the micromechanical actuator and on the other end attached to at least one of the two parallel wall portions. Affixitation of the closed contour in the split/cross valve enables a simple mounting of the micromechanical actuator, while still providing flexibility to the changeable closed contour.

In embodiments according to the fifth aspect, the micromechanical actuator is affixed to at least one of the two parallel wall portions on the crossing at a point on the closed contour. Using said affixitation enable simple and cost effective mounting of the micromechanical actuator in the split/cross valve.

Naturally, it is possible to combine the above-mentioned aspects, i.e. to implement micromechanical devices taking advantage of more than one of the aspects outlined above.

BRIEF DESCRIPTION OF THE DRAWINGS

Embodiments of the present invention will be detailed subsequently referring to the appended drawings, in which:

FIGS. 2a-b shows a side view of a planar micromechanical actuator in accordance with an embodiment of the second aspect of the present application, wherein FIG. 2b shows an enlarged view of a subsection of the planar micromechanical actuator;

FIGS. 3a-b show schematics of planar micromechanical actuators in accordance with aspects of the present application;

FIG. 4 shows a graph illustrating aspects of the inventions;

FIGS. 6a-b show a concept of reducing the dead volume used for the micromechanical pump in accordance with embodiments of the present application;

FIGS. 7a-b show subsections of micromechanical pumps according to embodiments of the third aspect;

FIGS. 12a-d show a micromechanical valve according to embodiments of the fifth aspect of the present application;

FIGS. 13a-d show a micromechanical valve according to embodiments of the fifth aspect of the present application;

FIGS. 17a-b show a membrane pump similar to the membrane pump in FIGS. 16a-b incorporating aspects of the present application;

FIGS. 18a-d show pumps according to aspects of the present application and configuration of pumps;

DETAILED DESCRIPTION OF THE INVENTION

Figure 1A:
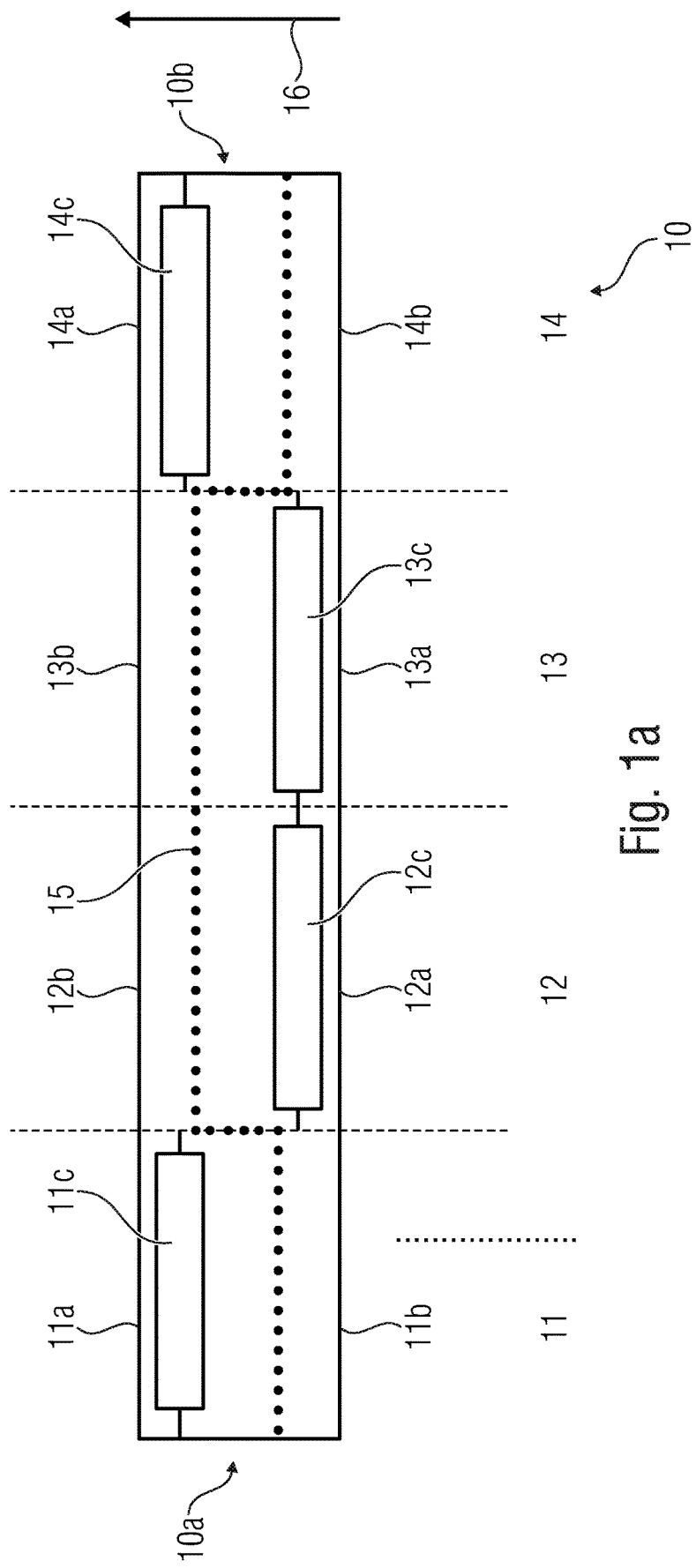
FIG. 1a-b shows a side view of a planar micromechanical actuator in a non-actuated state FIG. 1a and in an actuated state FIG. 1b, in accordance with an embodiment of the first aspect of the present application.

FIG. 1 shows a side view of a planar micromechanical actuator 10 in accordance with an embodiment of a first aspect of the present application. The planar micromechanical actuator 10 comprises a first segment 11, a second segment 12, a third segment 13 and a fourth segment 14. The first to fourth segments 11-14 each comprise a first electrode 11a-14a and a second electrode 11b-14b. Furthermore, each segment comprises a gap 11c-14c formed by the respective first electrode 11a-14a and the respective second electrode 11b-14b. Moreover, the planar micromechanical actuator 10 comprises a neutral axis 15 formed in the respective second electrode 11b-14b of each segment, offset to said neutral axis 15, the gaps 11c-14c are arranged along a thickness direction 16. Moreover, the first segment 11 is suspended on one end on a first suspension zone 10a and a fourth segment 14 is suspended on one end on a second suspension zone 10b opposing the first suspension zone 10a. The first and second electrodes are affixed to each other at each segment at the respective segments opposing ends along the direction between the opposing suspension zones 10a and 10b with being separated from each other via gap 11c-14c between the ends of the respective segment. Wherein in further embodiments the electrodes may be affixed to each other forming more than one gap in each segment.

Figure 1B:
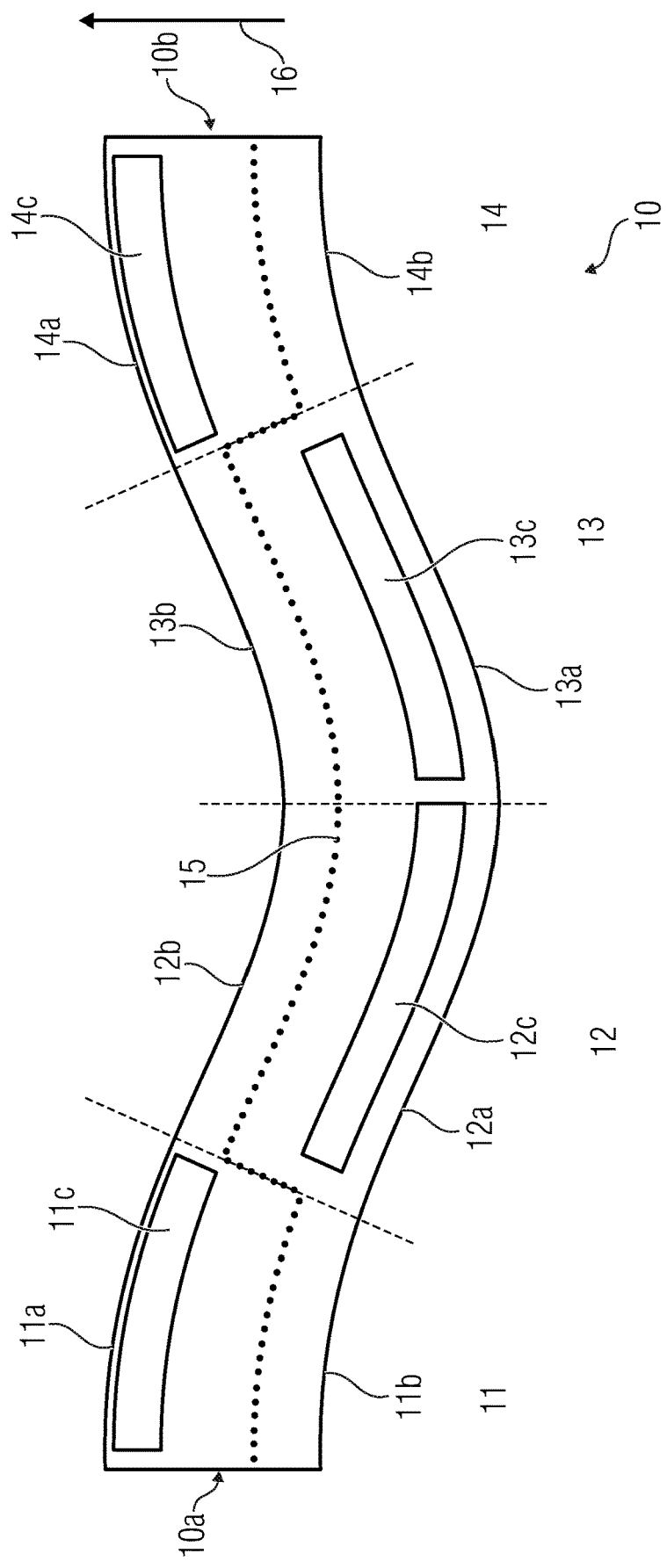

Upon application of a voltage to the respective first 11a-14a and second 11b-14b electrodes an attractive force leads to a deflection of the individual segments. In particular, an attractive force between the first electrode 11a and a second electrode 11b leads to a deflection of the first segment 11 into a direction opposing the thickness direction 16. Furthermore, an attractive force between the first electrode 12a and the second electrode 12b leads to a deflection of the second segment 12 in the thickness direction 16. It should be noted here that the term "thickness direction" is used to denote a first direction along a thickness, or perpendicular to lateral dimensions of the planar micromechanical actuator 10, with the opposing direction denoting a second direction pointing oppositely relative to the first direction. The segment 13 deflects like the segment 12 upon application of the voltage into the thickness direction 16. The fourth segment 14 deflects upon actuation, i.e. upon application of the voltage, into the direction opposing the thickness direction 16, as described for the first segment 11. The concurrent activation of the individual segments 11 to 14 by applying voltage between the first 11a-14a and second 11b-14b electrodes results in the planar micromechanical actuator 10 deflecting towards a direction opposite to direction 16 while being fixed at zones 10a and 10b, i.e. planar micromechanical actuator 10 bulges out opposite to direction 16 upon concurrent activation. The deflection of micromechanical actuator, i.e. the bulging out upon concurrent activation into the direction opposing the thickness direction 16, is shown in FIG. 1b. The bending curvature caused by segments 11 and 14 are compensated by the bending curvature of segments 12 and 13 so that the bulging out may be used to cause a fluid flow. An example is shown hereinafter as described for micromechanical actuator 10, only for segments 11-14 a short actuator 10 is obtainable. A short actuator enables a high actuation frequency and thereby a fast actuation. A fluid may therefore be pumped fast, i.e. with a high flow rate, with the described actuator 10. The underlying actuation principle of the planar micromechanical actuator 10 is described in more detail in WO2012095185. In alternative embodiments with differently shaped gaps actuators may be configured to deflect into the opposite directions compared to planar micromechanical actuator 10. Furthermore, gaps may be formed on each side of the electrode 11b-14b formed by an additional third electrode as shown with respect to FIG. 2.

Figure 2A:
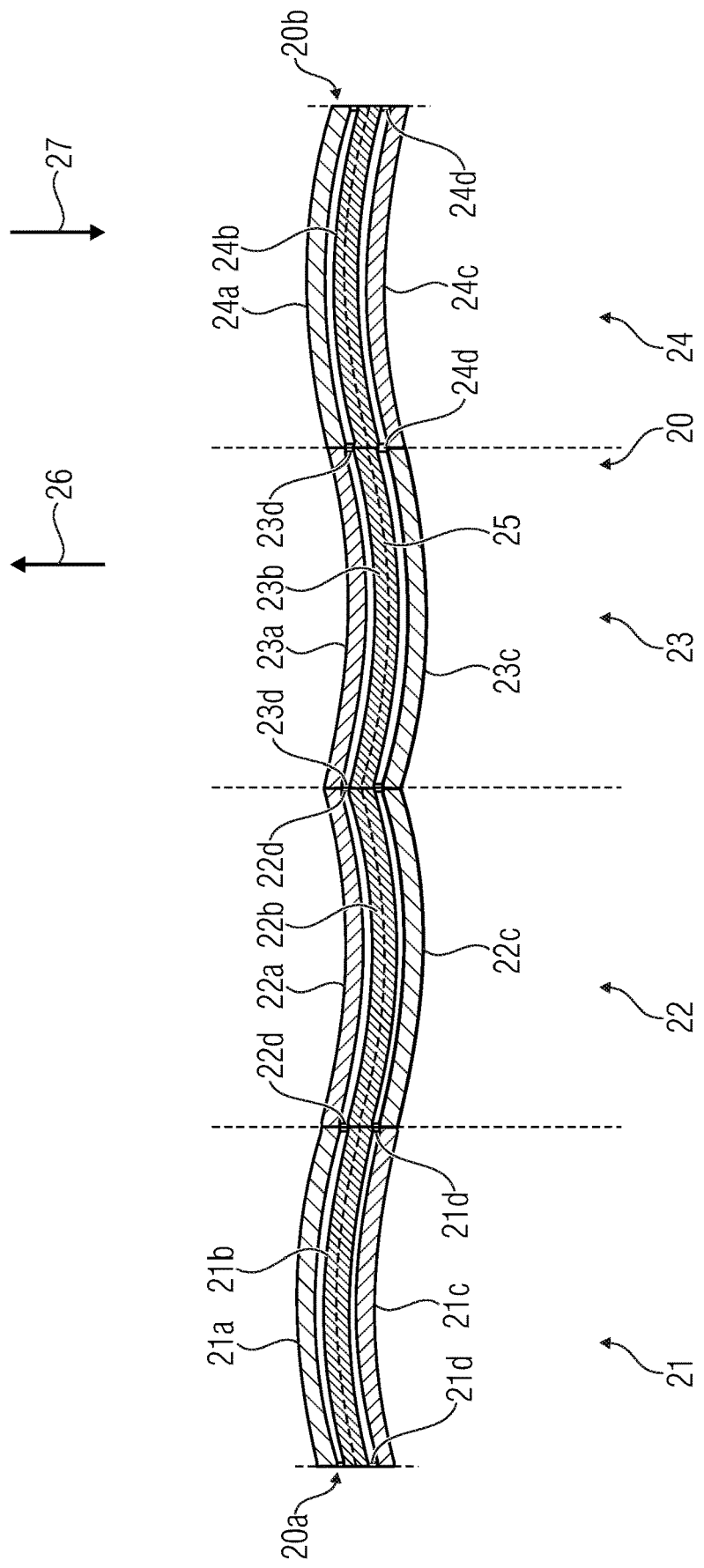

FIG. 2a shows a side view of a planar micromechanical actuator 20 in accordance with an embodiment of a second aspect of the present application, e.g., in an unactuated state. The planar micromechanical actuator 20 comprises a first subsequence of segments 21, a second subsequence of segments 22, a third subsequence of segments 23 and a fourth subsequence of segments 24. Each of the first to fourth subsequence 21-24 comprises a first 21a-24a, a second 21b-24b and a third 21c-24c electrode. For each segment the respective second electrode 21b-24b is sandwiched between the respective first 21a-24a and third 21c-24c electrode. The planar micromechanical actuator 20 is suspended on a first suspension zone 20a and a second suspension zone 20b which are arranged opposing, e.g. on opposite wall portions. Moreover, the planar micromechanical actuator 20 comprises a neutral axis 25 formed in the respective second electrode 21b-24b of each segment 21-24.

Although in FIG. 2a each subsequence of segments 21-24 of the planar micromechanical actuator 20 comprises only one segment, in further embodiments according to the second aspect each subsequence may comprise more than one segment. The segments of the first 21 and fourth 24 subsequence are shaped to bulge towards a first direction 26 and the segments of the second 22 and third 23 subsequence are shaped to bulge into a second direction 27. The bulged shape may be obtained, for example, by etching, e.g., deep reactive ion etching, in a semiconductor material such as silicon. The bulged out shape leads to arc shaped gaps between the electrodes based on which a more efficient deflection may be achieved compared to a planar gap based actuator. Furthermore, the planar micromechanical actuator 20 is configured to deflect into the second direction 27 upon application of a voltage to on one hand the first 21a-24a and third 21c-24c electrodes and, on the other hand, the second 21b-24b electrode.

The respective first 21a-24a and third 21c-24c electrode of each segment 21-24 are arranged distanced to the respective second 21b-24b electrode by spacers, although further embodiments according to the second aspect may affix the electrodes directly to each other without the need for spacers. Moreover, the third electrodes 21c and 24c have a smaller thickness than the first electrodes 21a and 24a in in the first 21 and fourth 24 subsequence of segments. Furthermore, the first electrodes 22a and 23a have a smaller thickness than the third 22c and 23c electrodes in the second 22 and third 23 subsequence of segments. In further embodiments the first and third electrodes may be formed having equal thickness. Moreover, to compensate for the varying thickness of the first 21a-24a and third 21c-24c electrode the planar micromechanical actuator 20 comprises spacers 21d, 22d, 23d and 24d which are configured such that an overall thickness of the planar micromechanical actuator remains substantially constant along the neutral axis 25. A position joining the second segment 22 and the third segment 23, e.g., a position of a spacer 22d and/or a spacer 23d next to each other and along the directions 26 and/or 27 may be considered as a center of the actuator 20, in particular in a case where the actuator is built symmetrically. The center point may move along the direction 27 upon actuation, i.e., when applying voltages to the electrodes. Thus, a joint, joining the second and third segments 22 and 23 may move along the second direction 27.

FIG. 2b shows an enlarged view of a segment of a planar micromechanical actuator according to the second aspect of the present application. The enlarged view may be part of the fourth subsequence 24 of the actuator 20. In particular, a section of the fourth subsequence 24 bordering the second suspension zone 20b may be illustrated. In this bordering section the second electrode 24b has a gradually decreased thickness towards the second suspension zone 20b. The reduced thickness produces a recess 24d' in the second electrode 24b that is filled by the spacer 24d. Moreover, to compensate for the reduced thickness of the second electrode 24b the third electrode 24d has a gradually increased thickness towards the second suspension zone 20b. The increased thickness of the second electrode 24c produces a protrusion 24d" to which the spacer 24d has a conforming recess. The increased thickness of the third electrode 24c is useful for connecting a third electrode with a greater thickness than the electrode 24c, e.g. electrodes 22c and 23c, while maintaining an overall thickness of the actuator, e.g. actuator 20 and the reduced thickness of the second electrode 24b may be compensated in an adjacent segment by a second electrode having a gradually increasing thickness which in turn may be compensated by conforming spacers.

FIG. 3a and FIG. 3b show schematics of planar micromechanical actuators 30 and 30', each comprising a sequence of segments between opposing suspension zones 30a and 30b. The planar micromechanical actuator 30 in FIG. 3a is segmented in subsequences of segments 31-34 between the opposing suspension zones 30a and 20b, wherein each subsequence of segments 31-34 comprises only one segment of equal length. The subsequences 31'-34' of planar micromechanical actuator 30' each comprise two segments of equal length. Thereby, planar micromechanical actuator 30 is a four segment (element) actuator and planar micromechanical actuator 30' is an eight segment (element) actuator. The planar micromechanical actuator 30 may be formed using the segments described in the context of planar micromechanical actuator 10 or 20. The segments used for planar micromechanical actuator 10 or 20 may also be used for the segments of the planar micromechanical actuator 30'. FIG. 3a and FIG. 3b furthermore illustrate stroke volumes $S_1$ and $S_2$ which is a volume of fluid which can be moved by the planar micromechanical actuators 30 and 30', respectively. The stroke volume $S_2$ is greater than the stroke volume $S_1$ due to the increased length of the planar micromechanical actuator 30' compared to the micromechanical actuator 30. However, micromechanical actuator 30 may have a higher actuation frequency compared to planar micromechanical actuator 30' due to its decreased length, in comparison to planar micromechanical 30' whereby it may be able to produce a greater fluid flow than planar micromechanical actuator 30'.

The planar micromechanical actuators 10, 20, 30 and 30' may also be called actuating entities (AE). In order to generate a "clamped/clamped" actuating entity 4N base actuators (lateral nano e-drive actuators: L-NED) may be needed, N actuators bending upward (first direction), followed by 2N actuators bending downward (second, opposing direction) and N actuators bending upward. base actuators may be segments, for example segments 11-14 of planar micromechanical actuator 10, segments of the subsequences of segments 21-24 of planar micromechanical actuator 20, segments 31-34 of planar micromechanical actuator 30 or segments of subsequences 31'-34' of planar micromechanical actuator 30'. Considering AE fabricated from a defined base actuator but with different N values, an effect of a variation on a stroke indirectly on a flowrate of a micropump using the described AEs is investigated in FIG. 4. A following approach may give a first solution to a problematic of the investigation. On one side, a longer strike generates more stroke. Multiplying by two a length of an actuator, e.g. actuating entity, increases by four the stroke volume. However, this also increases the footprint (needed space/size) on a system comprising the system (by 2 in length and also height due to an increase of this placement, i.e. more space may be needed) and consequently reduces an actuator density (actuator per unit surface e.g. of a wafer on which said actuators are implemented). On another side, a resonant frequency of a beam (AE, planar micromechanical actuator) with a specific bending stiffness, constant for any value of N, is inversely proportional to the square of the length of the beam. Reducing by two the length of the actuator (beam, AE, planar micromechanical actuator) will multiply by 4 the resonant frequency and thus indirectly a maximum actuation frequency. FIG. 4 presents a flowrate per surface area generated by AE (beam, planar micromechanical actuator) for various values of N, all using the same base element (segment). In the same manner, for a defined moment applied along the beam, the average pressure of the AE is proportional to In(L)/L. Increasing the size of the AE may decrease the generated pressure, being, directly, the capacity of transferring a quantity of fluid from one location to another per unit time and consequently the max actuation frequency.

FIG. 4 shows a graph wherein on the abscissa 41 number of cells per quarter beam are given, wherein a cell may be a segment as described for planar micromechanical actuators 10, 20, 30 or 30', and a quarter beam may be a subsequence of segments as described in context of planar micromechanical actuators 20, 30 and 30'. On the ordinate 42 a flowrate in ml per second×mm$^2$ is indicated. It is visible that for an increased number of cells (segments) the flowrate indicated on ordinate 42 is getting smaller. This is due to the fact that a planar micromechanical actuator with a smaller number of cells may be realized with a short length, wherefrom a high resonant frequency may be obtained, leading to a faster actuation of the planar micromechanical actuator and hence a faster transport of fluid.

Figure 5A:
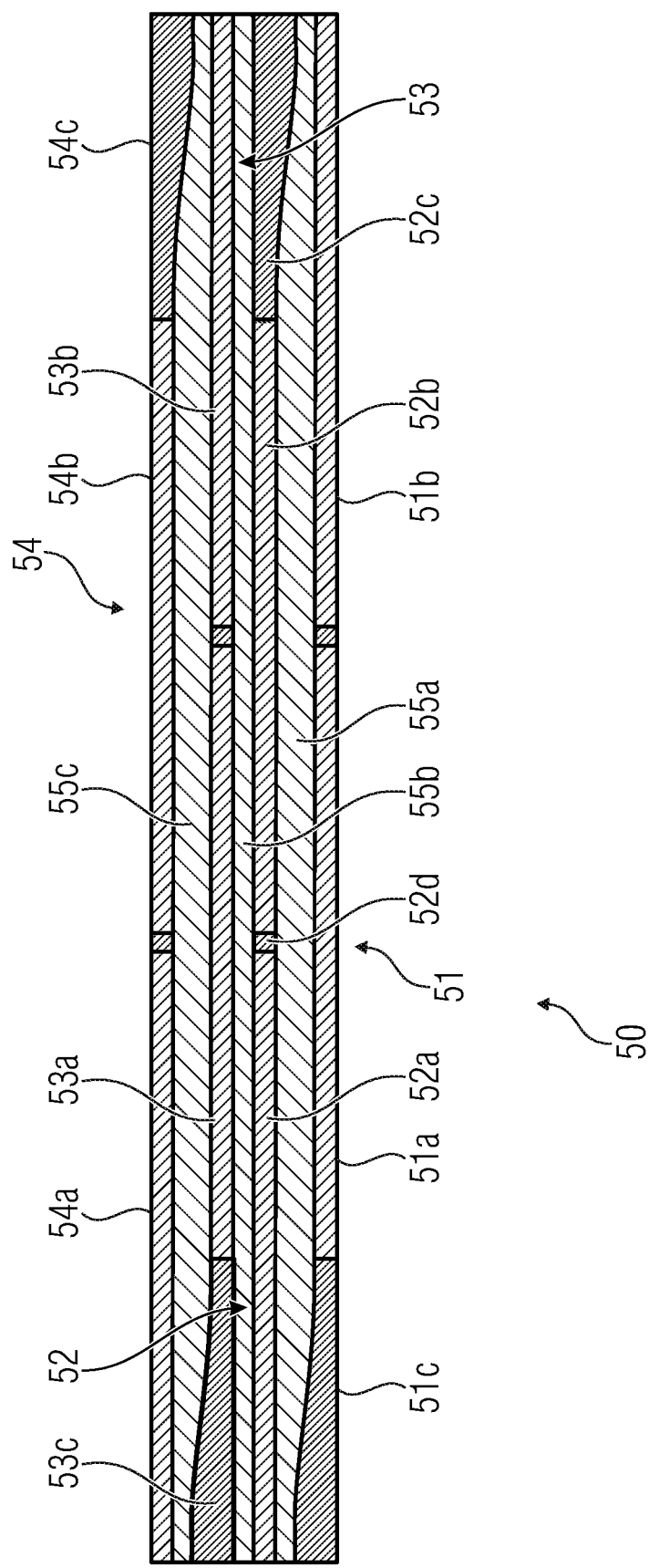
FIGS. 5a-b show side views of a micromechanical pump in accordance with an embodiment of the third aspect of the present application.
Figure 5B:
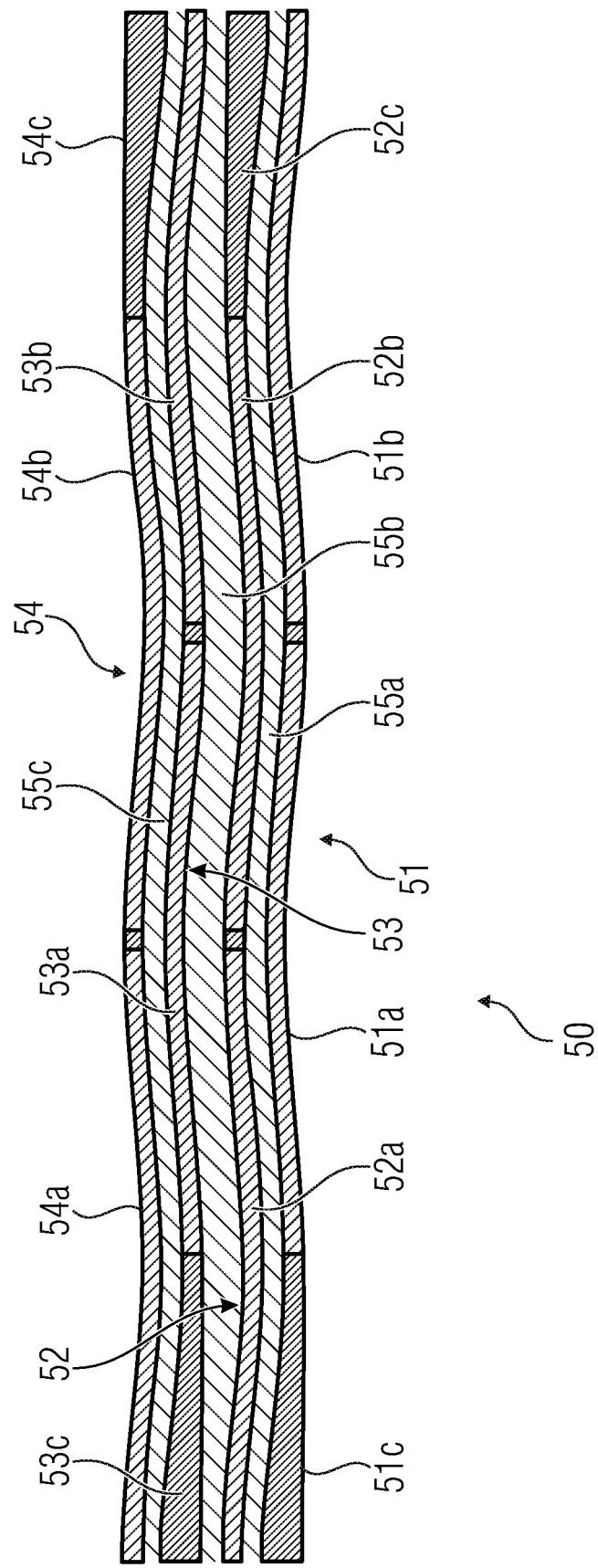

FIG. 5a and FIG. 5b show a side view of a micromechanical pump 50 in accordance with an embodiment of the third aspect of the present application. The micromechanical pump 50 comprises a first planar actuator 51 composed of first deflective portions 51a and 51b, a second planar actuator 52 composed of second deflective portions 52a and 52b, a third planar actuator 53 composed of third deflective portions 53a and 53b and an optional fourth planar actuator 54 composed of fourth deflective portions 54a and 54b. The planar actuators 51-54 are arranged along each other, e.g. in parallel. The first to fourth deflective portions 51a-54a and 51b-54b may be formed based on planar micromechanical actuators 10, 20, 30 or 30'. Furthermore, between the first planar actuator 51 and the second planar actuator 52 a first fluid passage 55a is formed, between the second planar actuator 52 and the third planar actuator 53 a second fluid passage 55b is formed and optionally, between the third planar actuator 53 and the fourth planar actuator 54 a third fluid passage 55c may be formed. Moreover, the first to fourth planar actuators 51-54 are suspended on opposite ends of the first to third fluid passages 55a-55c. A center of the first deflective portion 51a is aligned with a suspension zone 52d of the second planar actuator 52, a center of the second deflective portion 52a is aligned with a suspension zone 51c of the first planar actuator 51, a center of the third deflective portion 53a is aligned with a suspension zone 52d of the second planar actuator 52 and a center of the fourth deflective portion 54a is aligned with a suspension zone 53c of the third planar actuator 53. In other words, the deflective portions 51a-54a are arranged along each other in a shifted manner, i.e. the deflective portion 51a of the first planar actuator 51 may be aligned with the third deflective portion 53a of the third planar actuator 53 and the second deflective portion 52a of the second planar actuator 52 may be aligned with the fourth deflective portion 54a of the fourth planar actuator. Optionally, the suspension zones of the planar micromechanical actuators 51-54 may be implemented in suspenders 51c-54c. The first suspender 51c is formed such that upon deflection of the second deflective portion 52a of the second planar actuator 52 a space in between is decreased and a liquid may be pumped more efficiently outwards. The second suspender 52c is formed such that upon deflection of the first deflective portion 51b of the first planar actuator 51 a space in between is decreased and a liquid may be pumped more efficiently outwards. The third suspender 53c is formed such that upon deflection of the fourth deflective portion 54a of the fourth planar actuator 54 a space in between is decreased and a liquid may be pumped more efficiently outwards. The fourth suspender 54c is formed such that upon deflection of the third deflective portion 53b of the third planar actuator 53 a space in between is decreased and a liquid may be pumped more efficiently outwards.

FIG. 5a shows the micromechanical pump 50 in a non-actuated state, the first 55a and third 55c fluid passages are not contracted. In contrast, FIG. 5b shows the micromechanical pump 50 in an actuated state, i.e. the first 55a and third 55c fluid passages are contracted, i.e. have a reduced volume. Moreover, in the non-actuated state shown in FIG. 5a the second fluid passage 55b is contracted and has a decreased volume than in the actuated state shown in FIG. 5b, thereby a fluid may be sucked into fluid passage 55b upon actuation, which may for example be pressed out of the first or third fluid passages 55a or 55c. As the deflective portions 51a-54a and 51b-54b are arranged shiftedly to each other, the first to fourth planar actuators 51-54 engage each other upon actuation, more precisely the first planar actuator 51 engages the second planar actuator 52 and the third planar actuator 53 engages the fourth planar actuator 54. Through volume changes in the first to third fluid passages 55a-55c a fluid transport into or from the fluid passages may be achieved. The described micromechanical pump 50 is especially beneficial due to its efficient usage of space as both sides of the first to fourth planar actuator 51-54 are used for pumping. Moreover, due to the close arrangement of the first and second planar actuators 51 and 52 on the one hand and the third and fourth planar actuators 53 and 54 on the other hand, the volume in between not used for pumping is decreased, in other words, the dead volume, i.e. the remaining volume upon contraction of a fluid passage, is reduced. This reduction of dead volume is especially benefitted from the shifted arrangement of the planar actuators.

FIG. 6a and FIG. 6b show a concept of reducing the dead volume used for the micromechanical pump 50. In particular, FIG. 6a shows a first 61 and a second planar actuator 62 which are arranged concentrically in terms of their deflective portions. The first 61 and second 62 planar actuator are in an actuated state such that the volume in between is reduced. However, due to their concentric arrangement some dead volume 63 and 64 may remain in a fluid passage in between, in other words, the dead volume 63 and 64 does not contribute to a fluid flow. In contrast, FIG. 6b shows the first 51 and second 52 planar actuators which are arranged close to each other, such that a minimum volume is achieved in between. The shifted arrangement of the planar actuator 51 and the planar actuator 52 leads to a reduction of dead volume, i.e. the entire volume of the first fluid passage 55a may contribute to the pumping effect.

FIG. 7a shows a subsection of a micromechanical pump according to embodiments of the third aspect, wherein the subsection 70a comprises a first planar actuator 71 and a second planar actuator 72. The actuators 71 and 72 are shown in an actuated state. The first planar actuator 71 is composed of two first deflective portions 71a and 71b, and the second planar actuator 72 is composed of two second deflective portions 72a and 72b. A center of one of the first deflective portions, i.e. deflective portion 71a, is aligned with a suspension zone of the first planar actuator 72 and a center of one of the second deflective portions, i.e. deflective portion 72b, is aligned with a suspension zone of the first planar actuator 71. Moreover, between the first 71 and second 72 planar actuator a fluid passage 73 is formed which upon actuation of the first planar actuator 71 and second planar actuator 72 has a small volume.

FIG. 7b shows a subsection 70b of a micromechanical pump according to embodiments of the third aspect. The subsection 70b comprises the same first 71 and second 72 planar actuator as described for subsection 70a. However, the first 71 and second 72 planar actuator are arranged at a distance along each other, such that a fluid passage 76 formed in between the first 71 and second 72 planar actuator which maintains a substantial dead volume upon contraction of the first 71 and second 72 planar actuator. The described configuration for subsection 70b provides a mechanical pump with lower hydraulic resistance due to the increased volume of fluid passage 76 compared to the fluid passage 73. Moreover, pump subsections 70a and 70b provide by serial concatenation of deflective portions an ability to increase a flowrate of a pump compared to pumps comprising only a single deflectable portion per actuator, as described for micromechanical pump 50.

Figure 8:
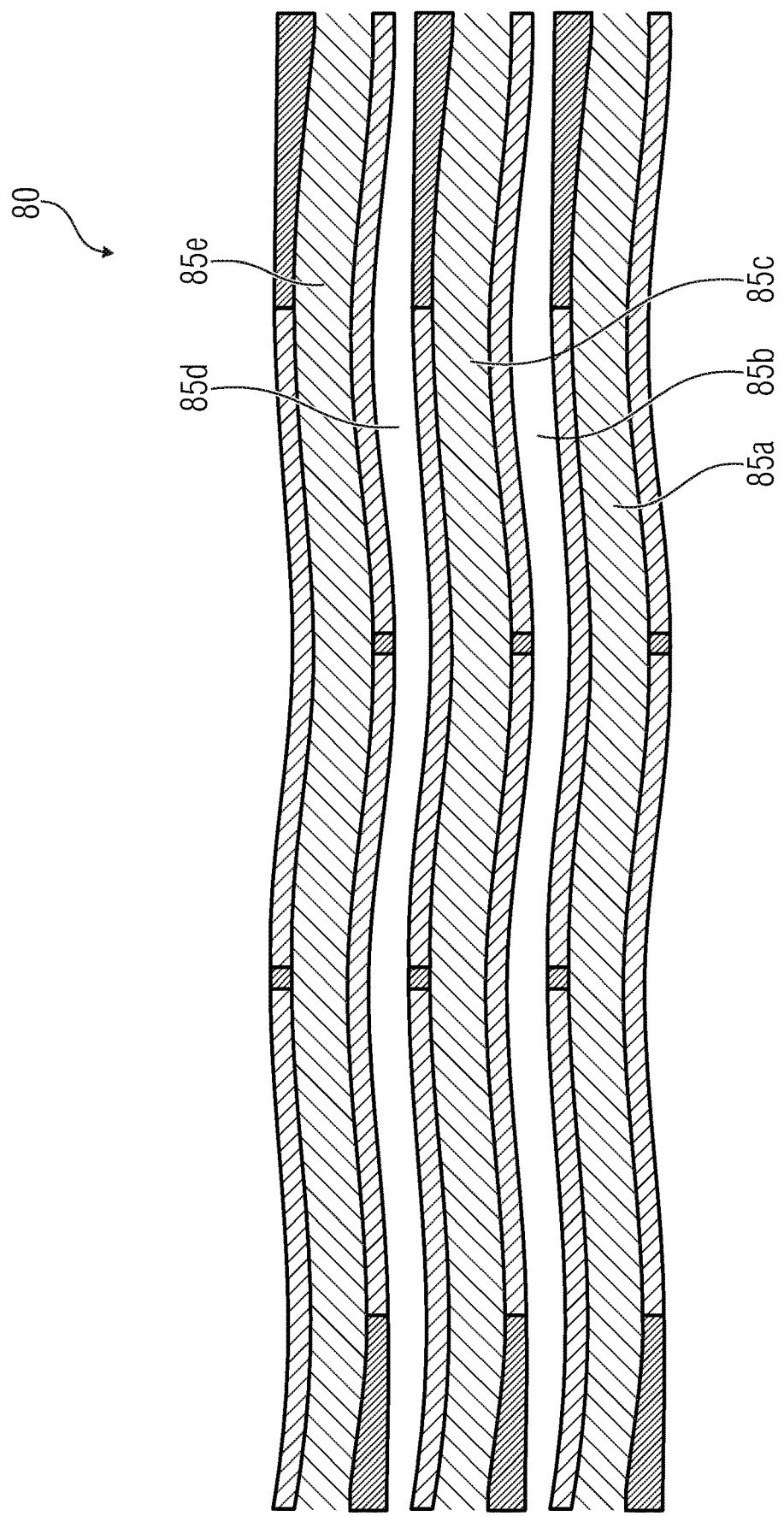
FIG. 8 shows a micromechanical pump 80 according to embodiments of the third aspect of the present application.

FIG. 8 shows a micromechanical pump 80 according to embodiments of the third aspect of the present application. The micromechanical pump 80 constitutes a combination of the concepts of the micromechanical pump 50 and the subsection 70b with additional fluid passages. More precisely, the micromechanical pump 80 comprises first to fifth 85a-e fluid passages, having substantial dead volume upon actuation. However, the micromechanical pump 80 based on subsection 70b has a lower hydraulic resistance compared to micromechanical pumps formed from subsection 70a due to increased dead volume in the fluid passages 85a-e. A low hydraulic resistance may be useful as it enables a fluid transport with a high flowrate.

Figure 9:
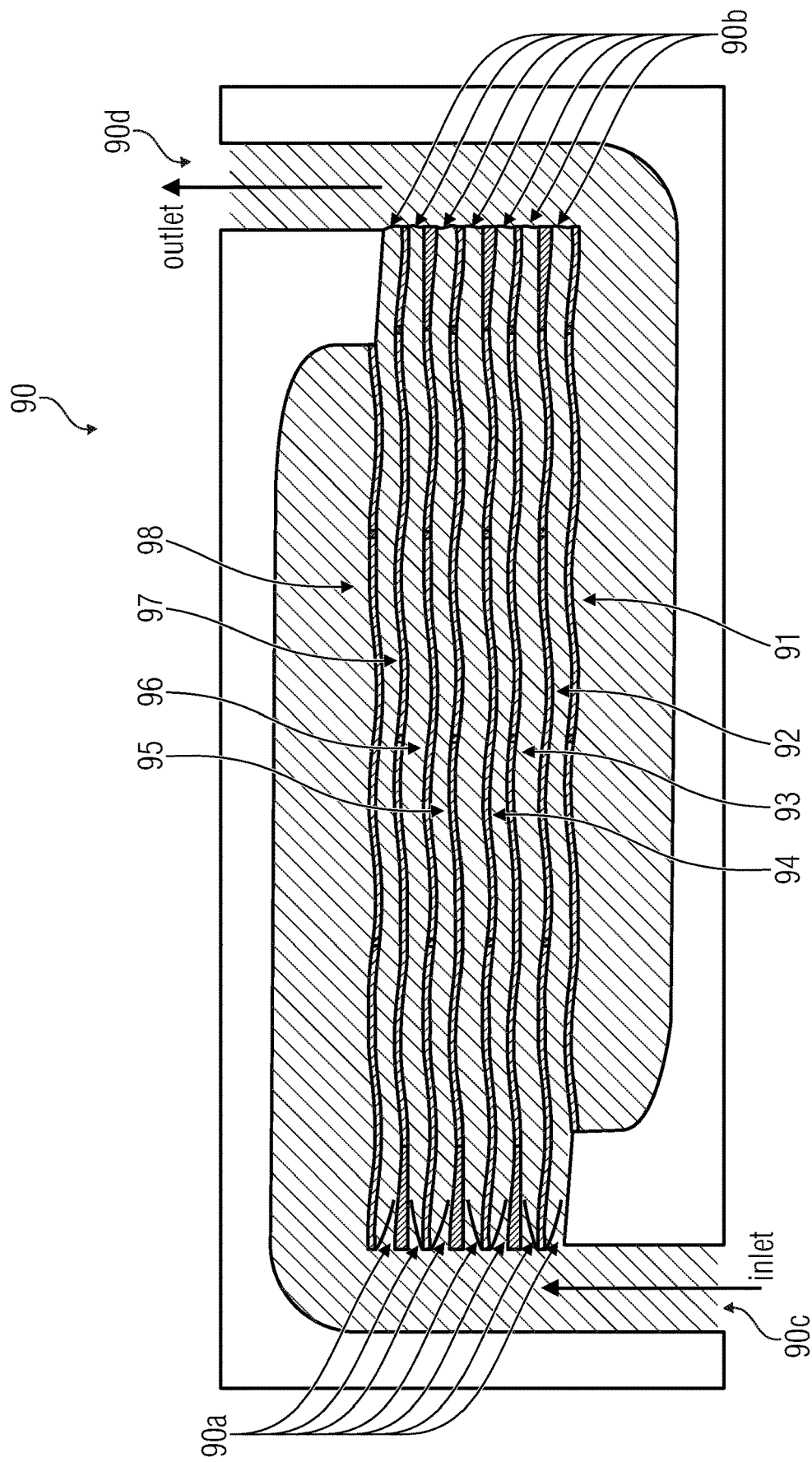
FIG. 9 shows a side view of a micromechanical pump according to embodiments of the third aspect of the present application.

FIG. 9 shows a side view of a micromechanical pump 90 according to embodiments of the third aspect of the present application. The micromechanical pump comprises first to eighth planar actuators 91-98, arranged along each other so as to form fluid passages in between the planar actuators 91-98. The planar actuators 91-98, or more precisely, the fluid passages are fitted with first check valves 90a on one end of the fluid passages and with second check valves 90b on an opposite end of the fluid passages. Moreover, the micromechanical pump 90 comprises a common fluid inlet 90c and a common fluid outlet 90d.

During actuation of the first to eighth planar actuators 91-98 the fluid is sucked in from the common inlet 90c and passes through the first check valves 90a into the fluid passages. Through volume changes in the fluid passages caused by actuation of the planar actuators 91-98 the fluid is transported out of the fluid passages through the second check valves 90b, wherein the first check valves 90a may avoid a back flow of fluid. After passing the second check valves 90b the fluid is transported out of the micromechanical pump 90 through the outlet 90d. A beneficial way of contracting the planar actuators 91-98 is by a peristaltic movement. A peristaltic movement might be formed by a sequential actuation of the deflective portions of the planar actuators 91-98 such that the deflective portions located next to the first check valves 90a may be actuated first and the deflective portions towards the second check valves 90b are sequentially actuated afterwards such that the deflective portions arranged nearer to the second check valves 90b are actuated after the deflective portions arranged further from the second check valves 90b.

Increasing the flow rate is linked to the number of AE that are working in parallel in order to transfer a liquid from a common inlet to a common outlet. The maximum generated back pressure can, in the same manner, be increased by joining AE in serial. A response associated with both stacking process is not linear. The non-linearity has not been evaluated so far and here, as a first approach, it is considered that a system has a linear response for both stacking configurations. In this case, for a given number of AEs, the AEs can be joined in serial and parallel for a specific flow rate and max back pressure. Multiplying the flowrate by 2 may then lead to a max back pressure divided by 2. A pump power, being half of the product of the flowrate by the max back pressure, which is a physical quantity that permits to associate those two parameters in order to express a capacity of a pump to transfer liquid. However, this quantity does not take into consideration a footprint of the pump. In a logic of integration (i.e. cost reduction), one has to consider the pump power density in order to correctly evaluate a capacity of a micropump. This quantity corresponds to the power of the pump divided by its active surface. This quantity is directly proportional to the AE "power density".

This quantity can be increased by properly thinking through the position of the different actuators working along each other. Three different approaches have been investigated in order to permit this stackability improvement:

When actuated, an AE is forming a symmetric bump, clamped on its both sides. As presented in FIG. 6a, a shift of two facing AEs as shown in FIG. 6b permits a perfect fitting and a large reduction of a dead volume. In order to integrate a shifted AE in a more complex structure, 2 fixed dummies, mimicking a shape of a "half actuator" may be added. As presented in FIGS. 5a-b, a serial integration of shifted AEs permits to avoid a repeated integration of those dummy structures. Interestingly, FIGS. 5a-b also presents an evaluation of a maximum displacement capability of an AE, in order to properly adjust a position of a facing structure. It is important to keep in mind that a minimum distance between two facing structures may be evaluated properly. Indeed, a relation flow rate/pressure is linked to a parameter named hydraulic resistance which is linked to a shape of a fluid path cross section, i.e. a fluid passage. In case of a slit, as considered for a presented actuator e.g. in FIG. 6b, a strong reduction of a width of a fluid path causes a strong increase of a hydraulic resistance and will reduce a flow rate and, consequently, an efficiency of a pump for a given AE pressure.

Figure 10:
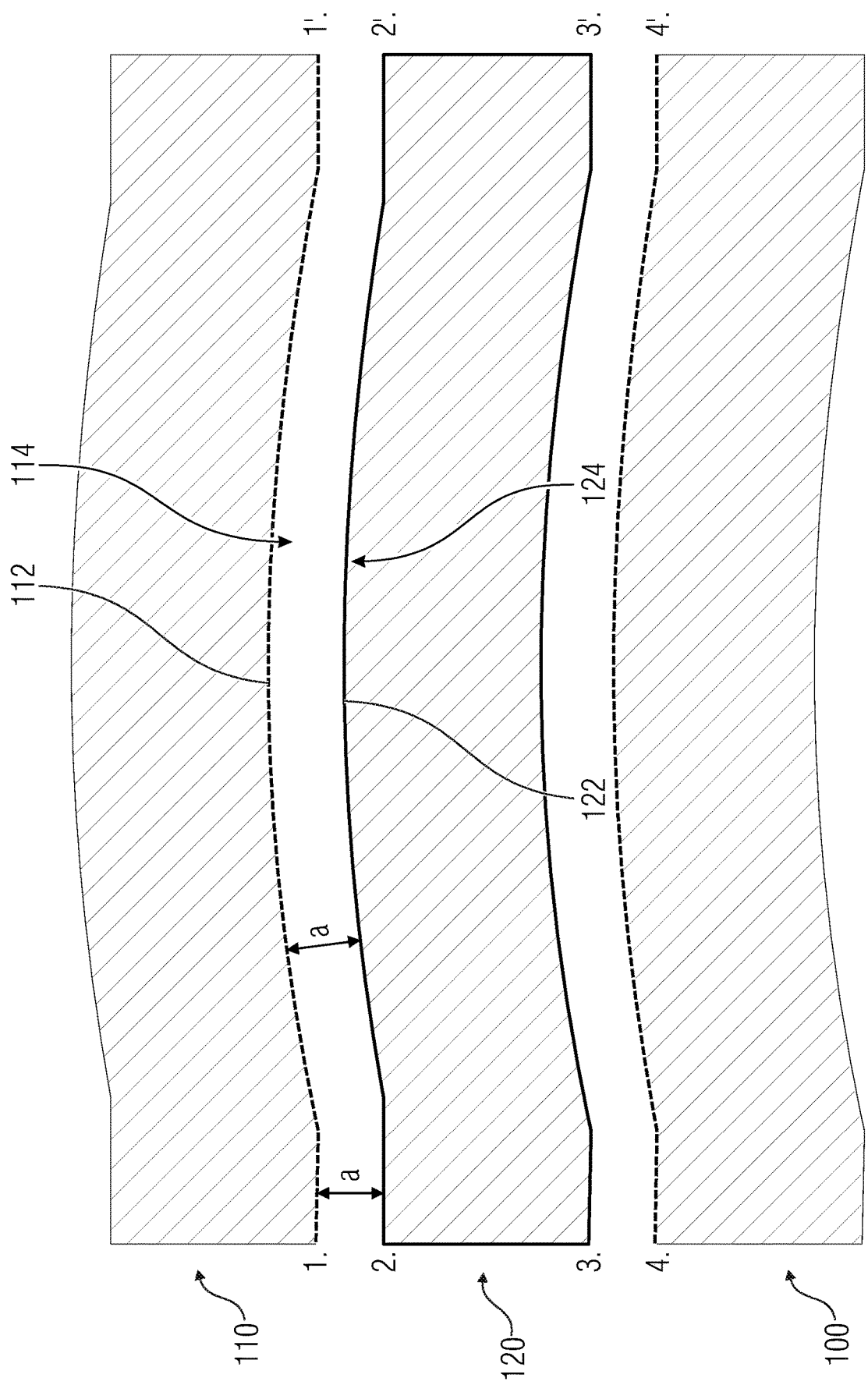
FIG. 10 shows a micromechanical actuator arrangement according to embodiments of the fourth aspect of the present application.

FIG. 10 shows a micromechanical actuator arrangement 110 according to embodiments of the fourth aspect of the present application. The micromechanical actuator arrangement 100 comprises a first planar micromechanical actuator comprising a first planar micromechanical actuator segment 110. The micromechanical actuator segment 110 has a surface 112 with a first curvature forming a recess 114 in the first planar micromechanical actuator segment. The micromechanical actuator arrangement 100 further comprises a second planar micromechanical actuator comprising a second planar micromechanical actuator segment 120. The second planar micromechanical actuator segment 120 has a surface 122 with a second curvature which forms a protrusion 124 of the second planar micromechanical actuator segment. The surface 112 of the first planar micromechanical actuator segment has a first curvature which has a greater radius than a curvature of the surface 122 of the second planar micromechanical actuator segment. The first planar micromechanical actuator segment 110 and the second planar micromechanical actuator segment 120 are arranged such that the surface 112 of the first planar micromechanical actuator segment 110 faces the surface 122 of the second planar micromechanical actuator segment 120. Moreover, the first planar micromechanical actuator segment 110 and the second planar micromechanical actuator segment 120 are arranged distanced to each other so that a distance between the surface 112 of the first micromechanical planar actuator segment 110 and a surface 122 of the second micromechanical planar actuator segment 120 is substantially laterally constant and retained when deflecting the first planar micromechanical actuator segment 110 and the second planar micromechanical actuator segment 120. For example, the curvature of the surface 112 is concentric with the curvature of the surface 122 such that upon actuation of the second micromechanical planar actuator segment 120 the protrusion 124 bulges towards the first micromechanical planar actuator segment 110 but remains a minimum distance to the first micromechanical planar actuator segment 110.

The described micromechanical actuator arrangement 100 is especially advantageous as stacking planar micromechanical actuators provides micromechanical actuator arrangements which may be able to produce a bigger pressure than a single planar micromechanical actuator. In particular, the micromechanical actuator arrangement 100 may provide twice the pressure that a single planar micromechanical actuator can provide. Moreover, due to the shape, i.e. recess 114 and protrusion 124, a closer stacking of the micromechanical actuator segments is possible. Through close stacking a high power or pressure can be obtained from a small sized micromechanical actuator arrangement. Therefore, the described arrangement 100 enables close packing of actuators and thereby result in a high power density, i.e. the arrangement 100 may not need a lot of area, for example on a wafer or in an integrated circuit, which may lead to material and therefore cost reduction of a product using said arrangement 100. As for every aspect, materials to be used as a substrate may comprise semiconductor materials such as single crystalline silicon but are not limited hereto.

In order to simplify schematics, a base element permitting to represent a base actuator (L-NED) may be shaped as a rectangle. However, following different studies operated from a design point of view, one knows that a NED effect, i.e. the actuation of aforementioned planar micromechanical actuators, is happening for specific shapes/topographies (e.g. most efficiently). The most efficient topography investigated so far has a shape of a dome (or arc shaped, i.e. actuators with a defined curvature), defined by two circles that can have independent radius. For specific needs, a L-NED systems can be stacked close from each other in order to increase their actuator horizon, from a force point of view, i.e. N actuators setup in parallel will permit to generate N time more force than one. In that case, an actuator may be separated enough to avoid achieving contact and friction between each other and may be brought close together enough in order to improve generated force per surface area. FIG. 10 is a support in order to illustrate this development. If one considers a base actuator defined between the curves 22' and 33', in order to fit perfectly with the previous and next actuator that are at a distance a from a central actuator, it may be needed that the curve 11', resp. 44', is an offset of the curve 22', resp. 33', at a distance a. However, all stacked actuators being similar from each other, a bottom, resp. a top, of each actuator may be similar. By defining a shape of 11', being an offset of the curve 22' at a distance a, one may impose the shape of the curve 33'. A shape of a bottom surface of an actuator may consequently be based on a shape of a top surface and a distance to a next actuator. A distance to a next actuator is directly linked to a capacity of an actuator to bend and to its length.

Figure 11A:
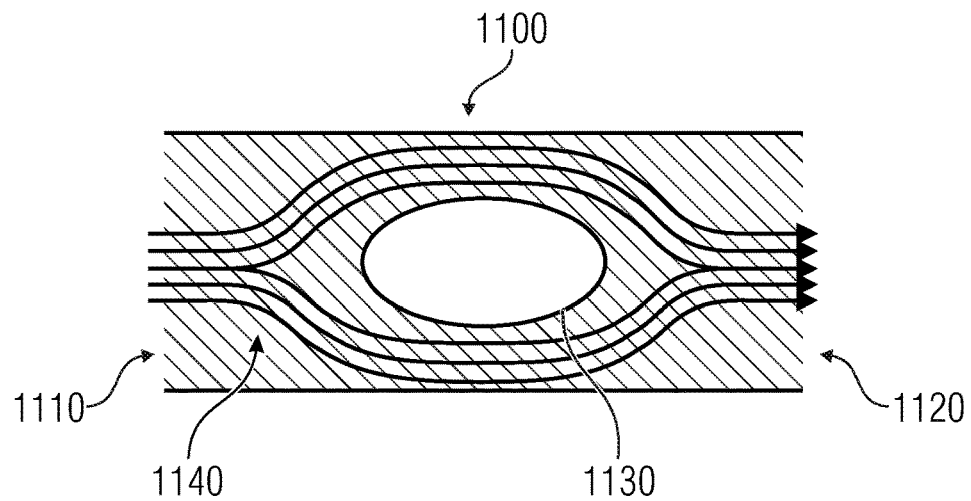
FIGS. 11a-c show side views of a micromechanical valve according to embodiments of the fifth aspect of the present application.
Figure 11B:
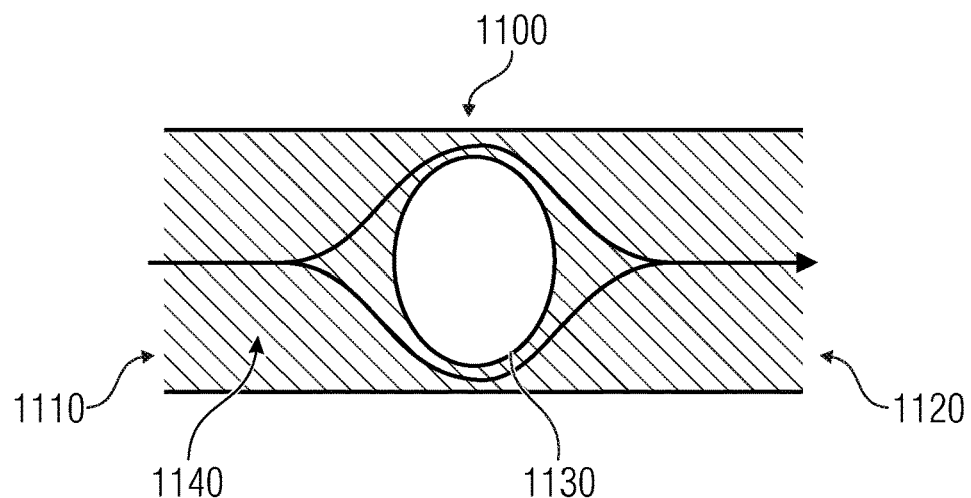
Figure 11C:
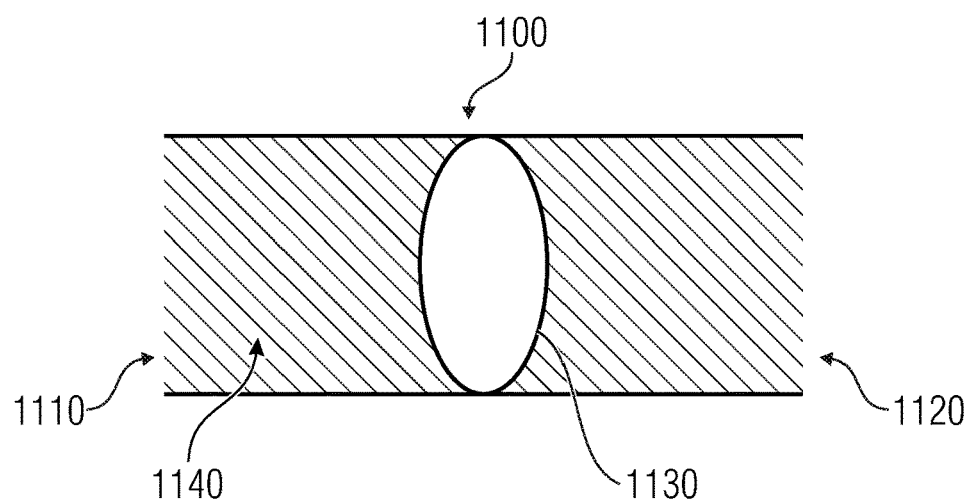

FIGS. 11a-c show side views of a micromechanical valve 1100 according to embodiments of the fifth aspect of the present application. The micromechanical valve 1100 comprises a first fluid port 1110, a second fluid port 1120, a micromechanical actuator 1130 and a fluid passage 1140 formed in between the first fluid port 1110 and the second fluid port 1120. The micromechanical actuator 1130 is arranged in the fluid passage 1140 and has a closed contour and is affixed at least on one parallel wall portion forming a base or a ceiling of the fluid passage 1140. Moreover, the closed contour of the micromechanical actuator 1130 is elliptical in FIG. 11a in a non-actuated state. Focuses of the elliptical shape of the micromechanical actuator 1130 are arranged in a direction parallel to the fluid passages in a non-actuated state. FIG. 11b shows the micromechanical valve 1100 in a first actuated state, i.e. the micromechanical actuator 1130 has a shape more similar to a circle, i.e. focuses of the aforementioned ellipses are less distanced. In turn, the fluid passage 1140 compared to the state described in FIG. 11a is less permeable for fluids, thereby a fluid flow regulation may be achieved. FIG. 11c describes a second actuated state of the micromechanical valve 1100 in which the micromechanical actuator 1130 has a closed contour in the shape of a ellipses, wherein the focuses of the ellipses are arranged in a direction perpendicular to the fluid passage 1140. Consequently, the fluid passage 1140 is nearly completely blocked or nearly impervious to a fluid in FIG. 11c as pointed ends of the elliptical shape are in connection with walls of the fluid passage 1140. Moreover, the micromechanical actuator 1130 may also be arranged on a wall of the fluid passage 1140 and extend upon actuation into the fluid passage 1140 by elongation towards another wall of the fluid passage 1140. Thereby, a fluid flow may be regulated and even avoided by elongation such that a connection of an elliptical shape of the micromechanical actuator 1130 to two walls of the fluid passage 1140 is achieved. An elongation may be obtained by changing the close contour from a circular shape towards an elliptical shape. Furthermore, the micromechanical actuator 1130 may be attached to the aforementioned parallel wall portions on a point on the contour or by at least two springs attached on substantially opposite ends of the closed contour.

Figure 12A:
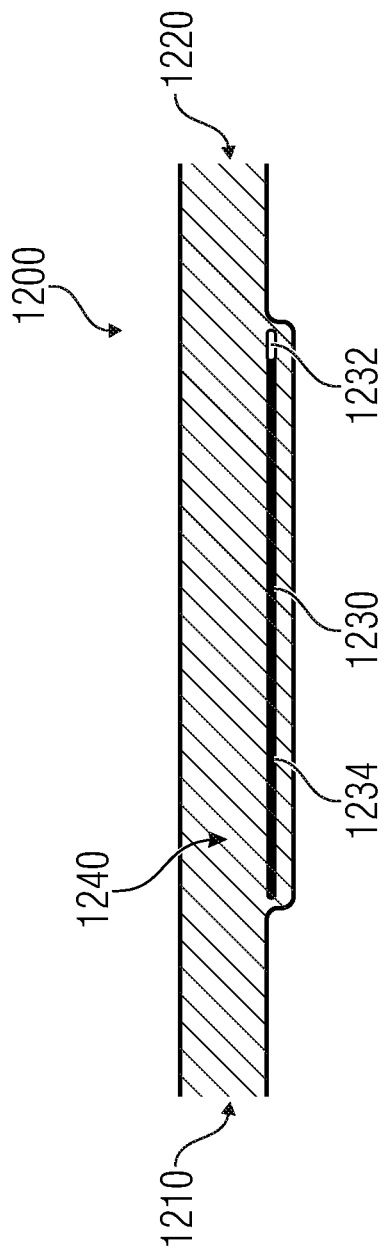
Figure 12B:
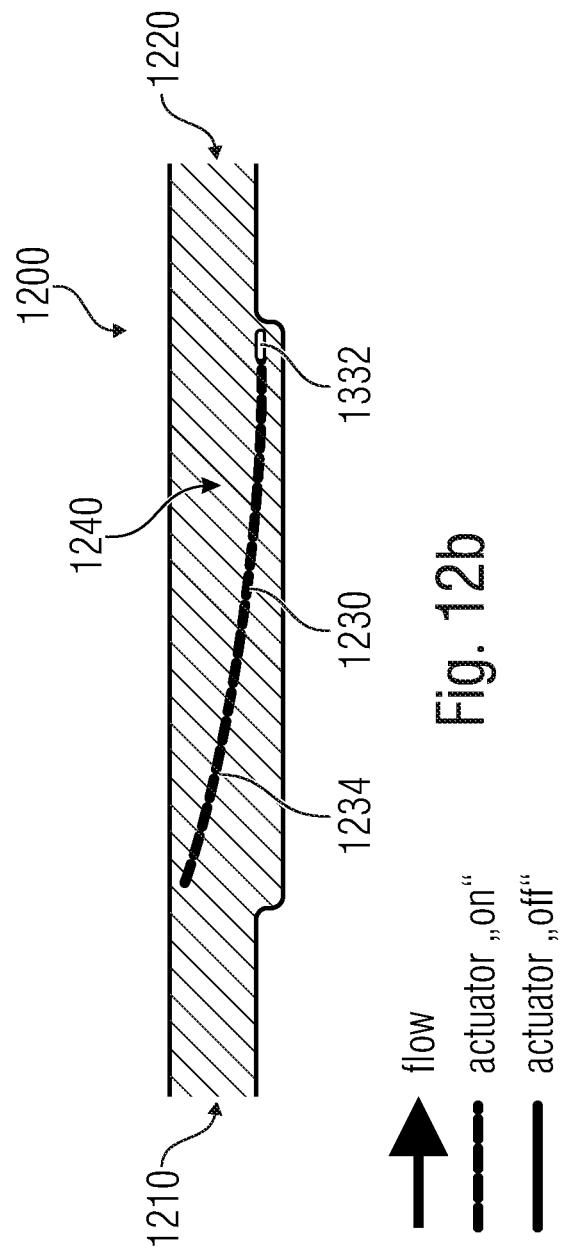

FIG. 12a-d show a micromechanical valve 1200 according to embodiments of the fifth aspect of the present application. The micromechanical valve 1200 comprises a first fluid port 1210, a second fluid port 1220, a planar micromechanical actuator 1230 and a fluid passage 1240 formed between the first fluid port 1210 and the second fluid port 1220. The micromechanical actuator 1230 is arranged on a wall of the fluid passage 1240 between the first fluid port 1210 and the second fluid port 1220 and comprises a suspended end 1232 and an unsuspended end 1234. In FIG. 12a the micromechanical actuator 1230 is in a non-actuated state and therefore arranged in parallel to a wall of the fluid passage 1240. Therefore, a fluid may flow through the fluid passage 1240 unhindered. In FIG. 12b the planar micromechanical actuator 1230 is in a first actuated state upon which the unsuspended end 1234 is deflected into the fluid passage 1240 such that a fluid may not flow freely through the fluid passage 1240, i.e. the fluid passage 1240 is blocked. FIGS. 12c and 12d show the usage of the micromechanical valve 1200 as a so-called check valve wherein a flow from one direction is permitted and a flow from an opposite direction is denied. This can be seen in FIG. 12c where the unsuspended end 1234 of the micromechanical actuator 1230 is deflected only partially into the fluid passage 1240 such that a fluid flow flowing along a direction from the suspended end 1232 to the unsuspended end 1234 is permitted. In FIG. 12d the actuator 1230 is in the same actuation state as in FIG. 12c, but due to a fluid flow flowing along a direction from the unsuspended end 1234 to the suspended end 1232 the micromechanical actuator 1230 is deflected to completely obstruct the fluid passage 1240. The complete deflection is achieved by pressure acting on the micromechanical actuator 1230 based on the non-permitted fluid flow. The described micromechanical valve 1200 can be beneficially used as a valve for reducing a fluid flow or as a check valve which flexibly enables flow from one direction while denying a flow from an opposite direction. Moreover, the micromechanical valve 1200 can be implemented with little additional space and material compared to a simple fluid passage as only a planar micromechanical actuator 1230 needs to be arranged on a wall of a fluid passage.

FIGS. 13a-d show a micromechanical valve 1300 according to embodiments of the fifth aspect of the present application. The micromechanical valve 1300 comprises a first fluid port 1310, a second fluid port 1320, a first planar micromechanical actuator 1330, a second planar micromechanical actuator 1350 and a fluid passage 1340 formed between the first fluid port 1310 and a second fluid port 1320. The first planar micromechanical actuator 1330 and the second planar micromechanical actuator 1350 are arranged on a wall of the fluid passage 1340 between the first fluid port 1310 and the second fluid port 1320. The planar micromechanical actuator 1330 comprises an unsuspended end 1334 and a suspended end 1332 and the second planar micromechanical actuator 1350 comprises an unsuspended end 1354 and shares its suspended end 1332 with the first planar micromechanical actuator 1330. FIG. 13a shows the micromechanical valve 1300 in an non-actuated state, i.e. the suspended 1332 and unsuspended ends 1334 and 1354 are arranged parallel to a wall of the fluid passage 1340 so that no fluid flow is hindered by the valve 1300 and a fluid may be flowing freely through the fluid passage 1340. In FIG. 13b the first micromechanical actuator 1330 is in an actuated state, i.e. the unsuspended end 1334 is moved into the fluid passage 1340 such that no fluid flow can take place in the fluid passage 1340, similar as described for the micromechanical valve 1200 described in FIG. 12b. In FIG. 13c the unsuspended end 1334 of the first planar micromechanical actuator 1330 is in a further actuation state, i.e. the unsuspended end 1334 is moved only partially into the fluid passage 1340. The described actuation state enables a fluid flow from the suspended end 1332 to the unsuspended end 1334 but denies a fluid flow in the opposite direction as depicted in FIG. 13d, similar as described for the micromechanical valve 1200 in FIG. 12c. In FIG. 13d a fluid flow from a direction along the unsuspended end 1334 to the suspended end 1332 leads to a blockage of the fluid passage 1340 such that a fluid flow in the described direction is denied. The described micromechanical valve 1300 flexibly allows a bidirectional check valve, compared to a unidirectional check valve which may be implemented by valve 1200, which can be used to efficiently and flexibly realize desired fluid flow directions.

Figure 14A:
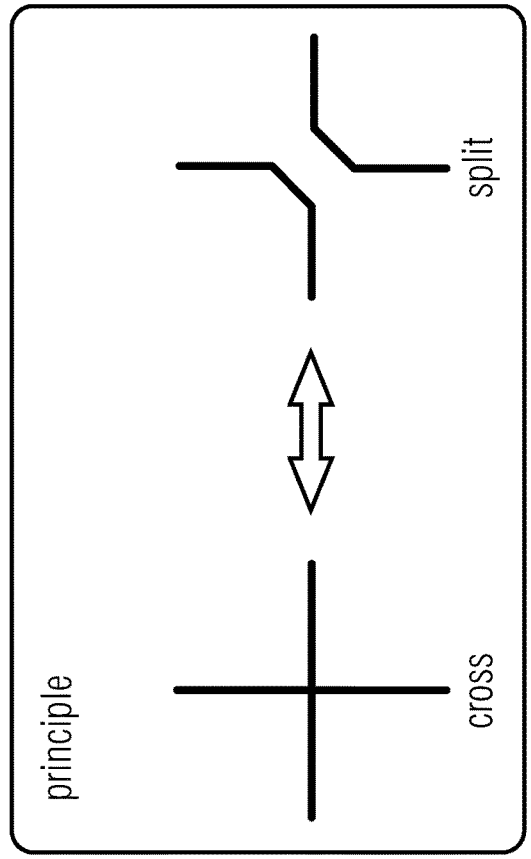
FIG. 14a shows a schematic of a principle underlying embodiments of the fifth aspect of the present application.

FIG. 14a shows a schematic of a principle underlying embodiments of the fifth aspect of the present application. In embodiments micromechanical valves may comprise a third and a fourth fluid port such that a so-called split/cross valve may be obtained. FIG. 14a shows a concept underlying those embodiments in which a configuration can be changed such that the valves can in a first state act as a cross and in a second state as a split valve. In a cross configuration a fluid may enter from one port and exit through any of the other available ports. In a split configuration a first fluid flow may enter from one port and exit from a predefined other port and a second fluid flow may enter from another port and exit from another predefined other port.

Figure 14C:
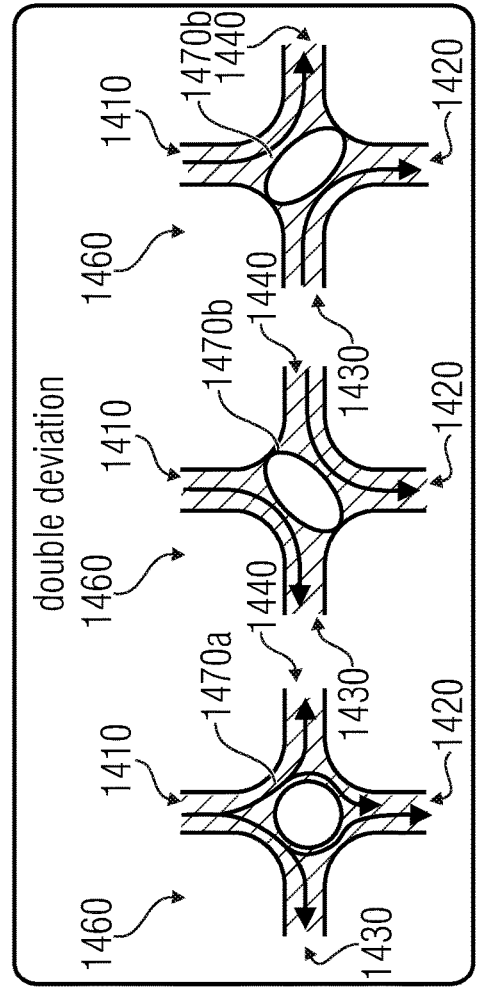
FIGS. 14b-d shows a micromechanical valve according to embodiments of the fifth aspect of the present application.
Figure 14B:
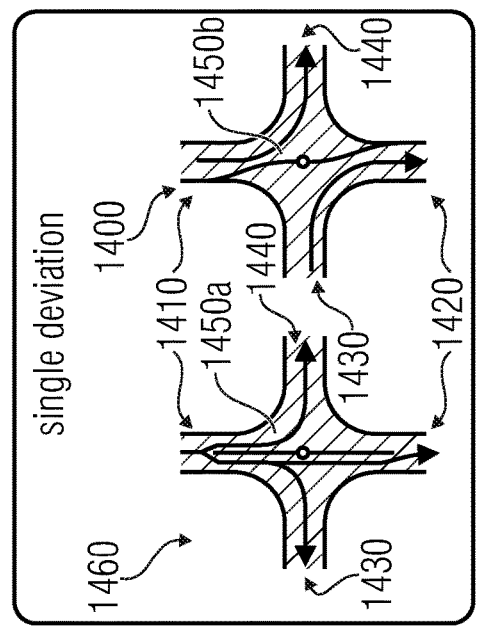

FIG. 14b shows a micromechanical valve 1400 according to embodiments of the fifth aspect of the present application. The micromechanical valve 1400 comprises a first fluid port 1410, a second fluid port 1420, a third fluid port 1430 and a fourth fluid port 1440. The first through fourth fluid ports 1410, 1420, 1430 and 1440 form a fluid crossing inside which a micromechanical actuator is arranged. Inside the micromechanical valve 1400 a planar micromechanical actuator is arranged comprising two deflectable portions and is shown in a non-actuated state 1450a and an actuated state 1450b. 1450a shows the micromechanical actuator in the non-actuated state 1450a whereby the micromechanical valve 1400 facilitates a crossing. In the actuated state 1450b the micromechanical actuator configures the micromechanical valve 1400 so that a connection only between the first fluid port 1410 and the fourth fluid port 1440 and only between the third fluid port 1430 and the second fluid port 1420 is available. Between the two deflective portions the micromechanical actuator 1450a and 1450b is affixed on a point of the two parallel wall portions of the valve 1400. Upon actuation 1450b the micromechanical actuator deflects each deflectable portions in opposite directions so that two separated fluid passages are formed.

FIG. 14c shows a micromechanical valve 1460 according to embodiments of the fifth aspect of the present application. The micromechanical valve 1460 is similar to the micromechanical valve 1400 and comprises the same ports 1410, 1420, 1430 and 1440. In between the fluid ports 1410, 1420, 1430 and 1440 a micromechanical actuator is arranged which has a closed contour and is shown in a non-actuated state 1470a whereby a fluid can freely pass from one port and exit through the remaining ports. The micromechanical actuator is shown in a first actuation state 1470b upon which only a fluid flow between the first fluid port 1410 and the third fluid port 1430 and only between the fourth fluid port 1440 and the second fluid port 1420 is enabled. In said first actuation state 1470b the micromechanical actuator changes its contour from a circular contour in a non-actuated state 1470a to an elliptical shape. In a second actuation state 1470c of the micromechanical actuator only a fluid flow between the first fluid port 1410 and the fourth fluid port 1440 and only a fluid flow between the third fluid port 1430 and the second fluid port 1420 is enabled. In the second state 1470c the closed contour is of elliptical shape but tilted by 45° compared to the first actuation state 1470b. The described valve 1460 enables a double deviation, i.e. a flexible splitting of the fluid passages is possible.

Figure 14D:
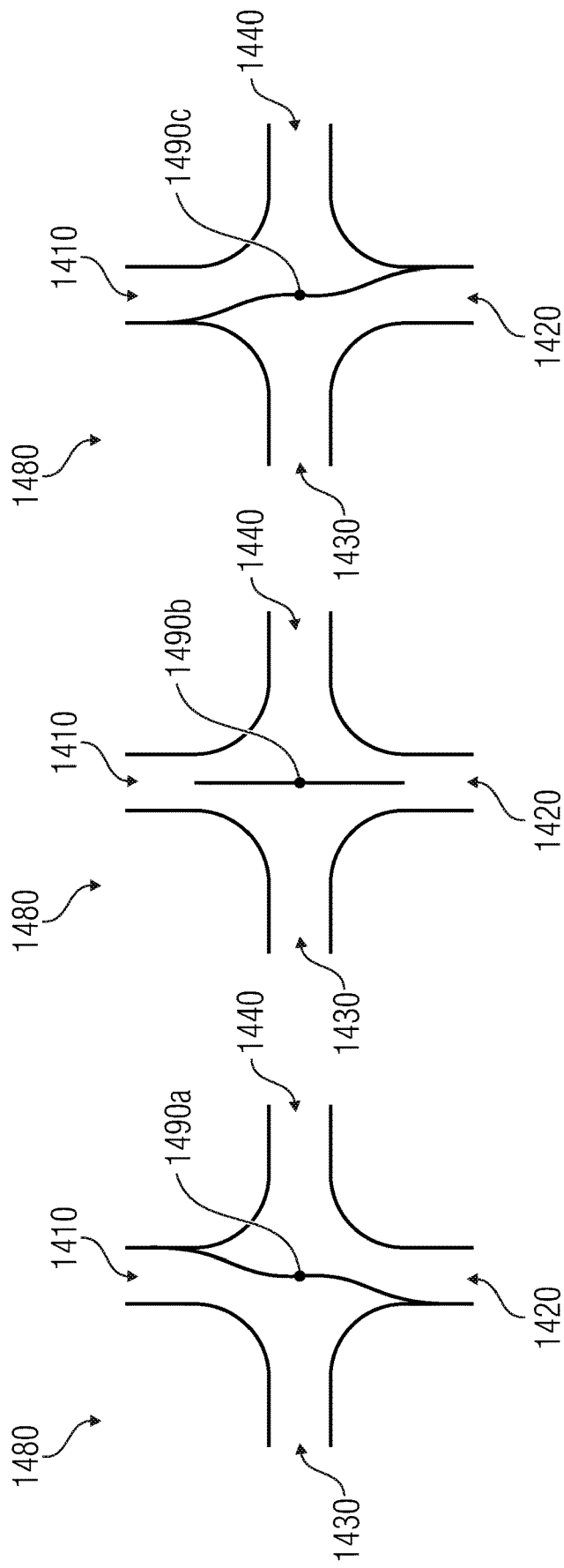

In FIG. 14d a micromechanical valve 1400 according to embodiments of the fifth aspect of the present application is shown. The micromechanical valve 1480 comprises similar to micromechanical valves 1400 and 1460 first to fourth fluid ports 1410, 1420, 1430 and 1440.

Moreover, the micromechanical valve 1480 comprises a micromechanical actuator arranged in between the fluid ports which is shown in a non-actuated state 1490a comprising two deflectable portions which are bent oppositely and the micromechanical actuator is affixed on a point between the deflectable portions on one of the parallel wall portions. In the non-actuated state 1490a the micromechanical valve 1480 enables a fluid flow between the first fluid port 1410 and the third fluid port 1430 only and between the fourth fluid port 1440 and the second fluid port 1420 only. The micromechanical actuator is pre-bent, such that the splitting is enabled to achieve the described split configuration. In a first actuated state 1490b the micromechanical actuator changes the micromechanical valve 1480 to a cross configuration. Thereby a fluid can flow freely between any of the ports, i.e. from one port to all of the remaining ports. This is achieved by actuating the micromechanical actuator such that the pre-bent shape is neutralized, therefore, the micromechanical actuator is of planar shape in the first actuation state 1490b. In a second actuation state 1490c the micromechanical actuator enables a fluid flow only between the first fluid port 1410 and the fourth fluid port 1440 and only between the third fluid port 1430 and the second fluid port 1420. In the second actuation state 1490c the micromechanical actuator is mirrored on a suspension point and has a mirrored shape compared to the non-actuated shape 1490a. The micromechanical actuator may be suspended in the micromechanical valve 1480 in the same way the micromechanical actuator is suspended or affixed in the micromechanical valve 1400.

Figure 15A:
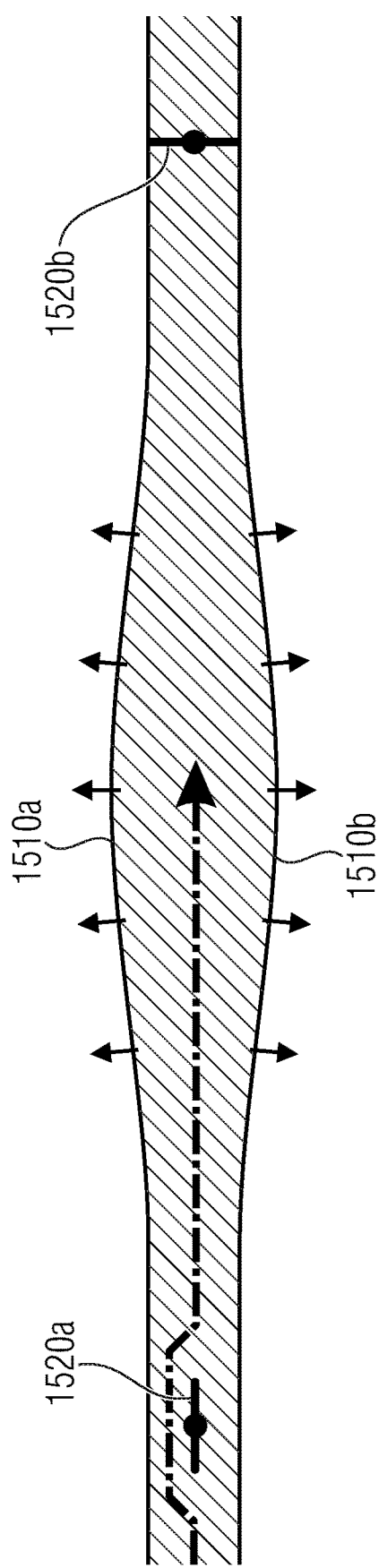
FIGS. 15a-b a combination of concepts related to aspect one and aspect two on the one hand and with aspect five on the other hand are shown.
Figure 15B:
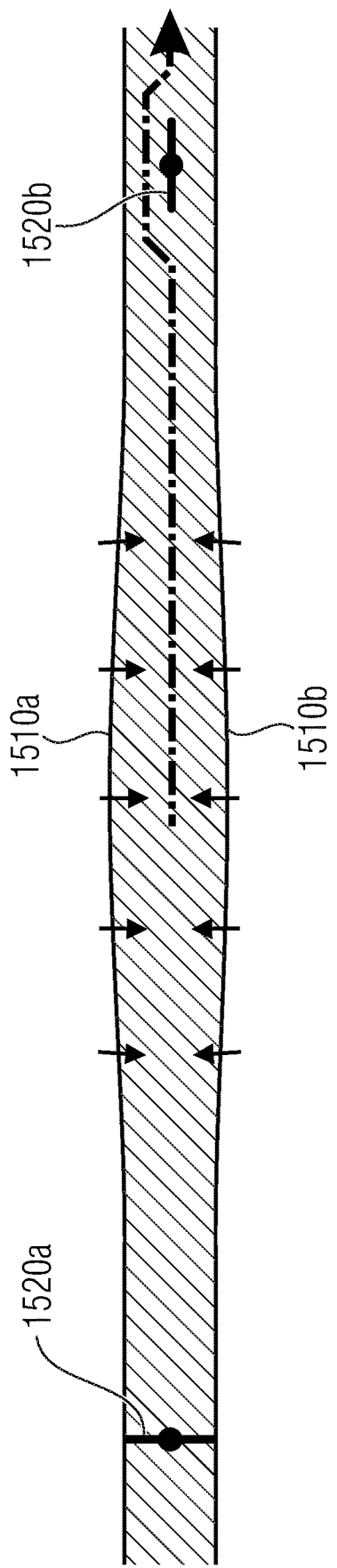

In FIG. 15a and FIG. 15b a combination of concepts is illustrated with respect to aspect one and aspect two on the one hand and with aspect five on the other hand. FIG. 15a shows a fluid passage formed by opposing walls 1510a, 1510b which may be formed by one of the planar micromechanical actuators described with respect to aspect one and two. Furthermore, the fluid passage comprises a first valve 1520a which may be any of the valves described with respect to aspect five and a second valve 1520b which may be any of the valves described with respect to aspect five. Upon actuation of the opposing walls 1510a and 1510b the walls 1510a and 1510b deflect such that the volume of the fluid passage is increased causing a fluid flow into the passage which is furthermore enabled by the first valve 1520a being open and the second valve 1520b being closed in FIG. 15a. Through the described opening and closing up of the valves 1520a and 1520b a flow direction may be defined. In FIG. 15b the deflection of the walls 1510a and 1510b is inverted, i.e. the volume in the fluid passage decreases and the fluid may flow through the open second valve 1520b and be denied to flow back through the closed first valve 1520a in FIG. 15b. Using the valves as described with aspect five for valves 1520a-b is beneficial for a fluid flow as a pressure loss may be avoided when compared to using passive check valves. The avoidance of pressure loss is due to the fact that the valves 1520a and 1520b may be active and therefore no pressure from a fluid flow may need to be diverted into opening and closing of valves A solution in order to achieve a reconfigurable micropump is proposed, permitting to tune, for a constant pumping power, a flow rate or a maximum back pressure. Few base elements may be added to the already presented pool of ideas with respect to the individual aspects.

1. A "regulating" valve (FIG. 11a-c) permits to modify a flow rate for a defined pressure from negligible leakage flow to max flow, directly defined by the fluidic path of the valve when open.

The combination of two "regulating" valves (FIGS. 15a-b), set up in opposite state, and alternatively passing from "on" to "off" position synchronously with a displacement of the NED generating side walls of a chamber, permitting to reduce a pressure drop imposed by a passive valve.

2. An active valve may use a principle of NED to change its general topography, and make a shape of a fluid path evolving. A valve can allow unidirectional flow or entirely block the channel (FIGS. 12a-d).

3. A directional valve, presented in FIG. 13a-d, is a combination of active valves that permit to commute a "passing" direction of a system.

4. A "split cross" valve, as presented in FIG. 14c, permits to transform a crossing of 2 channels into two separated channels, independent from each other.

Figure 16B:
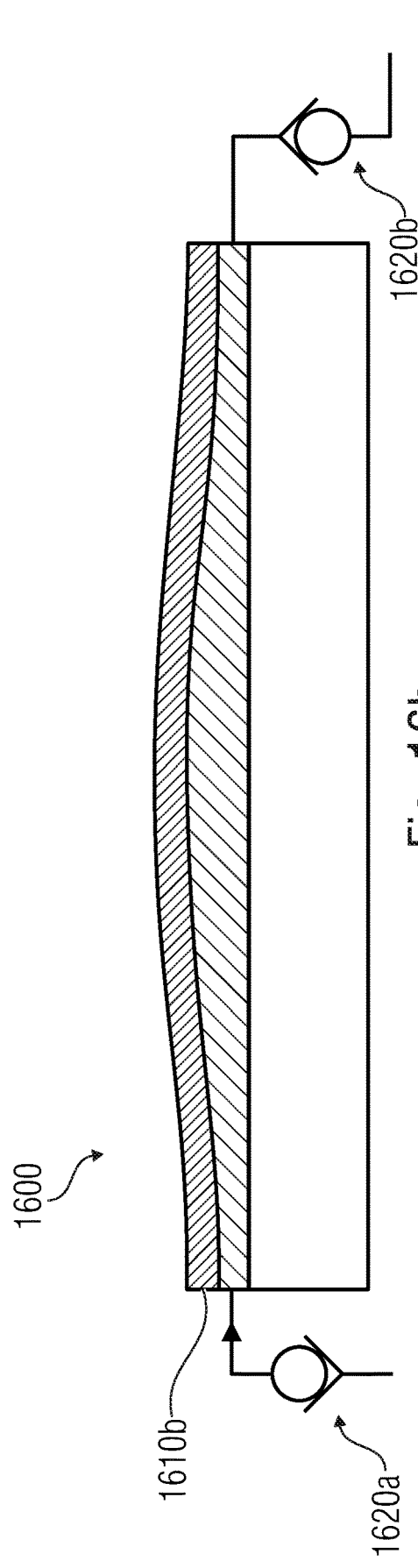
FIGS. 16a-b show a membrane pump which combines concepts from aspect one, two and five of the present application.
Figure 16A:
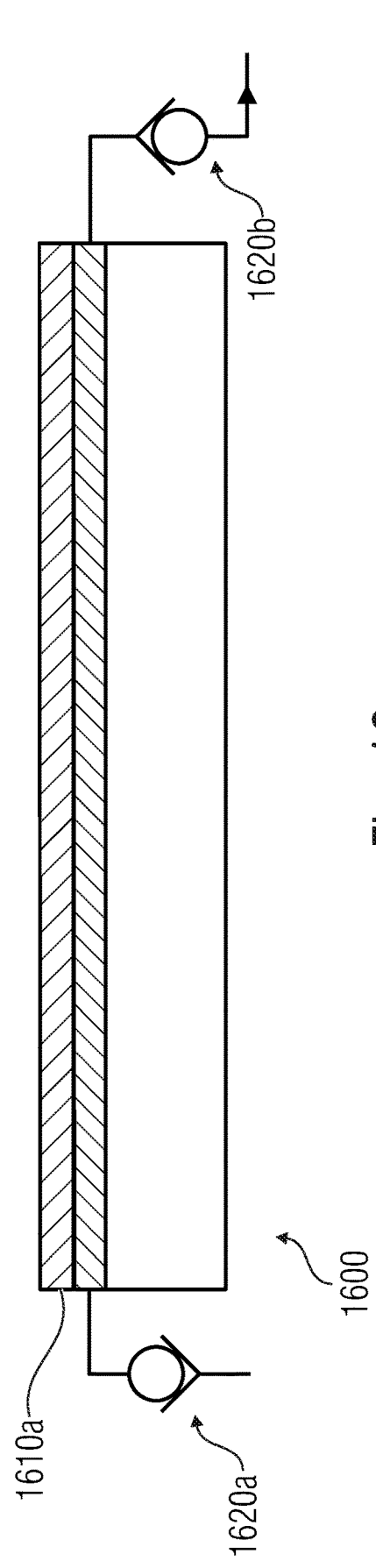

FIG. 16a and FIG. 16b show a membrane pump 1600 which combines concepts from aspect one, two and five of the present application. The membrane pump 1600 comprises a deflectable membrane which may be formed using the micromechanical actuators 10, 20, 30 or 30'. Moreover, the membrane pump 1600 comprises a first check valve 1620a and a second check valve 1620b. The membrane is shown in a non-actuated state 1610a and in 1610b the membrane is shown in an actuated state. Upon actuation 1610b of the membrane in FIG. 16b a fluid is sucked into a volume beneath the membrane through the first check valve 1620a and upon release of the actuation 1610b the deflection is reversed to obtain the membrane in the non-actuated state 1610a and the fluid is pumped out through the check valve 1620b. The check valve 1620a avoids backflow as it is an unidirectional check valve. The same applies to the check valve 1620b upon actuation 1610b of the membrane.

FIGS. 17a and 17b show a membrane pump 1700 similar to the membrane pump 1600. In addition to the membrane pump 1600 a second reservoir is used on top of the membrane so that a greater portion of the surface of the membrane is used for the pumping.

In a standard case (FIGS. 16a-b), a fluid is localized under the membrane. On the other side of the membrane is air. This has various consequences that will be enumerated:

1. The membrane may be perfectly watertight; however, it may be clamped on its entire perimeter, reducing its stroke for a defined applied moment.
2. When applying a moment, the membrane is bending and generate a stroke sucking a fluid. When releasing the moment, a pressure of the cavity, in reference to the other side of the membrane, is linked to the pressure generated by the deformed membrane:

$$P_{cavity} = P_{Membrane}$$

In a case of a membrane using its both sides in the pumping process (FIG. 17a-b), a following improvement may be considered:
1. The membrane may not need to be perfectly sealed on its outside, only clamped or double clamped. This permits to increase a degree of freedom of the structure, and consequently its stroke for a defined applied moment
2. When releasing the structure from a bent position, both side of the membrane generate opposite pressure permitting to push a liquid from an original location and, at the same time, to suck it to a final location.

Figure 18B:
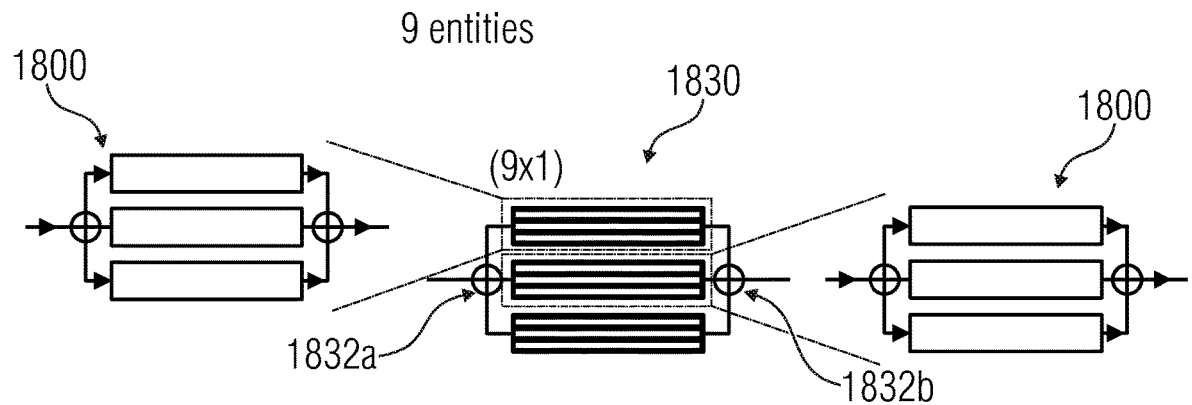
Figure 18C:
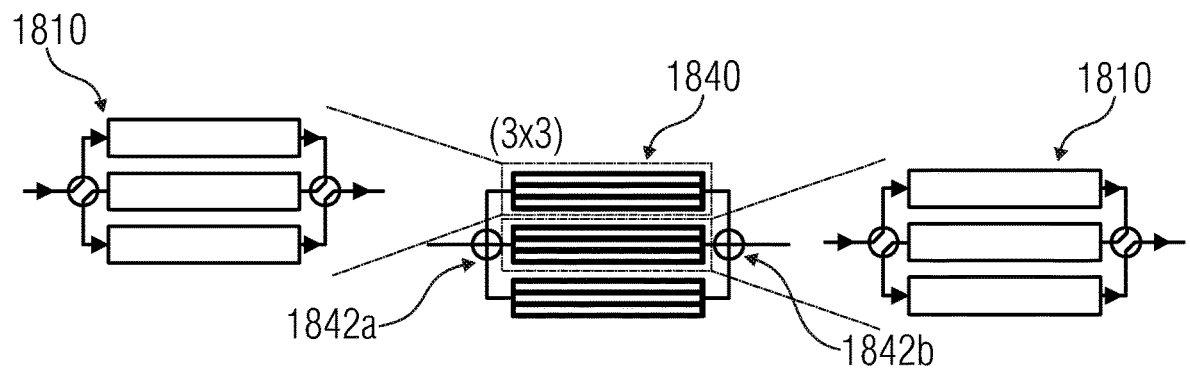
Figure 18D:
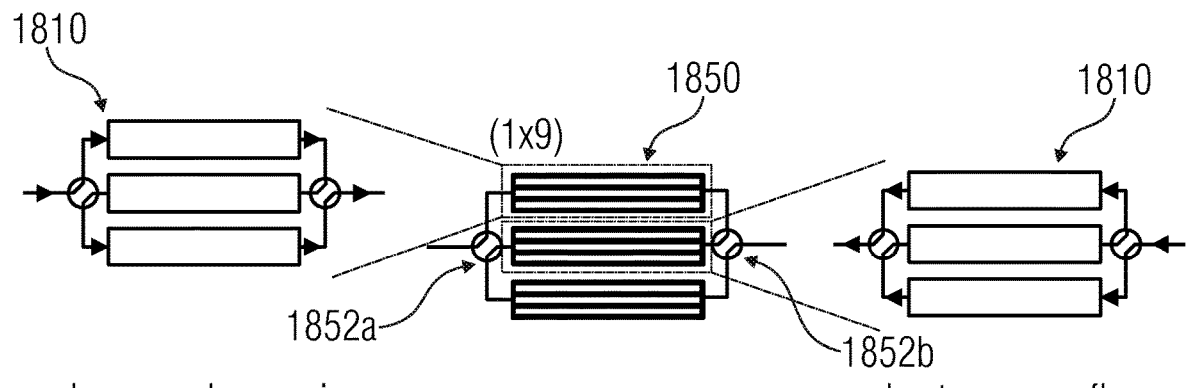

FIG. 18a shows a parallel pump 1800 and a linear pump 1810 combining aspects of the present application. The parallel pump 1800 comprises three pumping entities 1804a-c, a first cross valve 1802a and a second cross valve 1802b. A port of the first cross valve 1802a is used as an input valve and the remaining three output ports are each connected to one of the pumping entities 1804a-c. Three ports of the second split valve 1802b are each connected with one of the pumping entities 1804a-c and a fourth port of the second cross valve 1802b serves as an output of the pump 1800. Using three pumping entities 1804a-c in parallel facilitates a flowrate which is three times higher than when using only one pumping entity, for example 1804a. The pump 1810 comprises similarly to the pump 1800 three pumping entities 1804a-c, a first split valve 1812a and a second split valve 1812b. A first valve of the first split valve 1812a serves as an input port from which the fluid is routed to the pumping entity 1804a which pumps the fluid into a second split valve 1812b from which the fluid is guided into the pumping entity 1804b and back into the first split valve 1812a wherefrom it is guided into the pumping entity 1804c and into the second split valve 1812b to the output. The described configuration of the pump 1810 enables a serial or linear configuration of the pump although the pumping entities 1804a-c may be arranged along each other so as to obtain a pump with a pressure three times as high as a pump consisting of only one pumping entity. FIG. 18b illustrates a pump 1830 comprising three parallel pumps 1800 which are arranged in parallel such that an overall pump 1830 comprising nine pumping entities circuited in parallel is obtained. A pump with nine pumping entities in parallel is able to produce a flowrate nine times bigger than one pumping entity. In addition to the three parallel pumps 1800, pump 1830 involves a first cross valve 1832a and a second cross valve 1832b connecting to the three parallel pumps 1800. FIG. 18c illustrates a pump 1840 which comprises three serial or linearly circuited pumps 1810 which are arranged in parallel by use of a first cross valve 1832a and a second cross valve 1852b. The pump 1840 is able to produce a flowrate three times bigger than a single entity and a pressure three times bigger than a single entity denoted by 3×3. FIG. 18d shows a pump 1850 comprising three linear pumps 1810 which are interconnected linearly by split valves 1852a and 1852b. The pump 1850 is able to produce nine times as much pressure than a single pumping entity. Moreover, the pumps 1830, 1840 and 1850 can be realized as a single pump which upon change of the valve configurations turn into a serial or a parallel configuration.

Interaction of the valves (described with respect to FIGS. 11a-c, 12a-d, 13a-d 14a-d) with pumping chambers (e.g. 1800 or 1810) permits to reconfigure a pump as desired, as presented in FIGS. 18a-d. In a 1st example (pump 1800), a pump is based on 3 chambers that can be considered as separated entities. In a "parallel" case (1800), their inlet channels as well as an inlet channel of an entire system, in the same way that entities and entire system outlet channel, are all on a same side and joined to a "split cross" valve in "cross" position. In a "linear" case (1810), an inlet channel of a 2nd entity, as well as an outlet channel, is reversed. Channels in a left side as well as in a right side of a system are linked together using a "split cross" valve in "split" position. It is important to note that for this system, a careful positioning of 6 passive valves permits to achieve pumping in the "parallel" and "serial" configuration. In a second example, the pump is based on 9 elements. In that case, 3 main configurations can be considered: all 9 entities working in parallel (9×1), all 9 entities working in serial (1×9) and a combined mode composed of 3 parallel blocks of 3 serial entities (3×3). In each configuration, valves imposing the direction of the flow are all set up in blocks composed of 3 entities. For each block, 2 "split cross" valves permit to pass from a parallel to serial entities logic. For a full system, 2 "split cross" valves permit to pass from a parallel to serial block logic. In the central block, and contrary to the 2 other blocks, the flow direction is changing when the blocks are in serial configuration, imposing to use of directional valves.

In the case of the second example, a case treated here is using each entity in their full pumping logic, along all flow rate/back pressure logic of a pump (FIGS. 18a-d). However, a configuration based on blocks, each containing a different number of entities, can also be achieved, for example 3 entities in serial, in parallel with 6 entities in serial. In that case, a pressure/flowrate relation is not linear anymore.

A reconfigurable pump may be implemented, based one any number of entities equal or bigger than 2. In each case, a position and type of valves used for a development of a pump has to be thought as a function of a specificity of the pump.

Such a reconfigurable pump can integrate several pressure and flowrate sensors, depending on a number of chambers used in a system, in order to internally evaluate its fluidic behavior. Generated data may then be interpreted and used in order to reconfigure in real time its configuration to fit properly a requirement of external components. If, for example, in a specific configuration, a generated backpressure is higher than a maximum back pressure achievable by the system, a strong loss in flowrate will occur, resulting in an automatic transfer of pumping chambers from parallel to serial logic.

Figure 19:
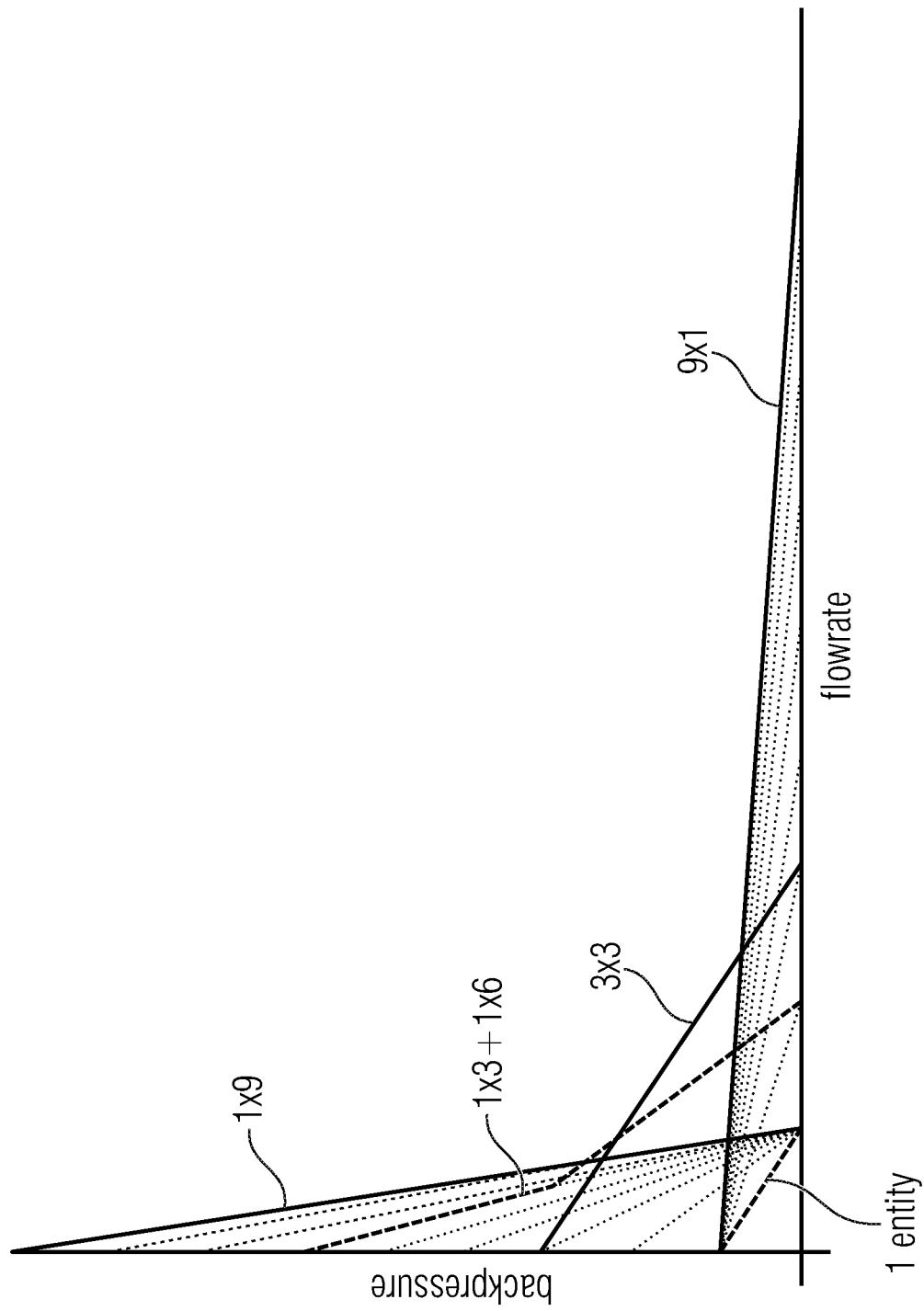
FIG. 19 shows a graph illustrating the dependence of flowrate and pressure with respect to pump configurations.

FIG. 19 shows a graph illustrating the dependence of flowrate and pressure. On the abscissa the flowrate is shown and on the ordinate pressure is shown. A pump configuration with nine entities in parallel indicated by 9×1, for example pump 1830, is able to produce a large flowrate while only producing a small back pressure. On the other hand, a pump with a 1×9 configuration, i.e. nine pumping entities in serial, for example pump 1850, is able to produce a large back pressure while only producing a small flowrate. An intermediate setup with three entities in parallel, wherein the entities themselves are configured to work in series enables a medium flowrate and a medium back pressure indicated by 3×3. The described pumps in FIGS. 18a-d therefore enable a flexible choice of back pressure to flowrate.

Figure 20:
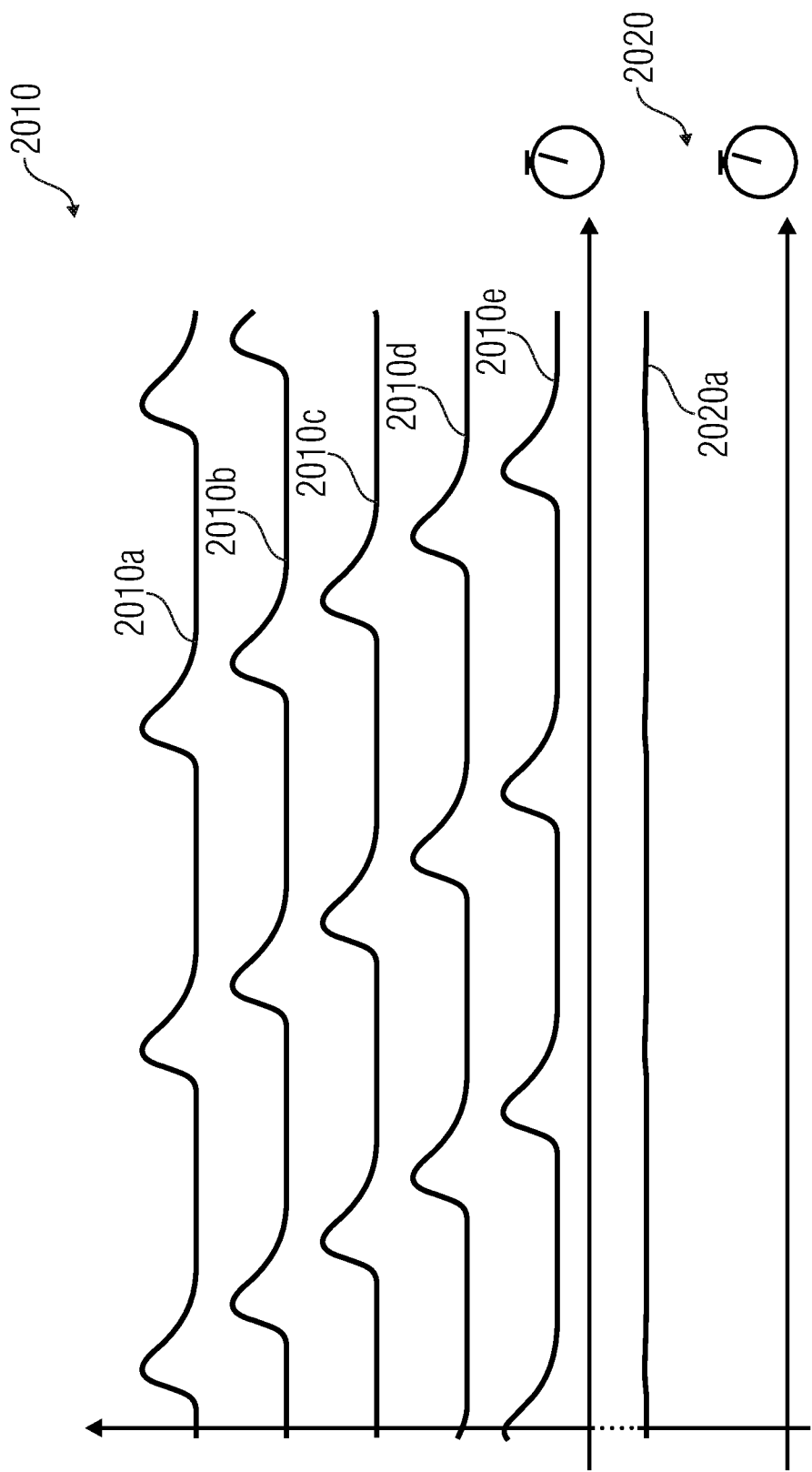
FIG. 20 shows graphs according to concepts of the present application

FIG. 20 shows a first graph 2010 showing flowrates 2010a-e over time which is indicated on the abscissa and flowrate on the ordinate. The individual flowrates 2010a-e are shifted such that their maximums do not coincide. The flowrates may be produced by pumps as described in the previous embodiments and the pumps may be configured to work in parallel so that the flowrate as described in graph 2020 is obtained. In graph 2020 a flowrate 2020*a* is shown which is substantially constant over time. Therefore, according to aspects of the invention using the aforementioned embodiments pumps can be produced which are able to generate a substantially constant flowrate.

The flow rate of a parietal micropump is subject to large variation over a pumping period due to a logic of pumping of a system. This phenomenon is named pulsation. FIG. 20 present on its first line a variation of a flowrate over few pumping periods. A implementation of a small delay, in pumping logics of several pumping entities working in parallel, permits to level the flowrate over the actuation period, see Graph 2020.

Figure 21:
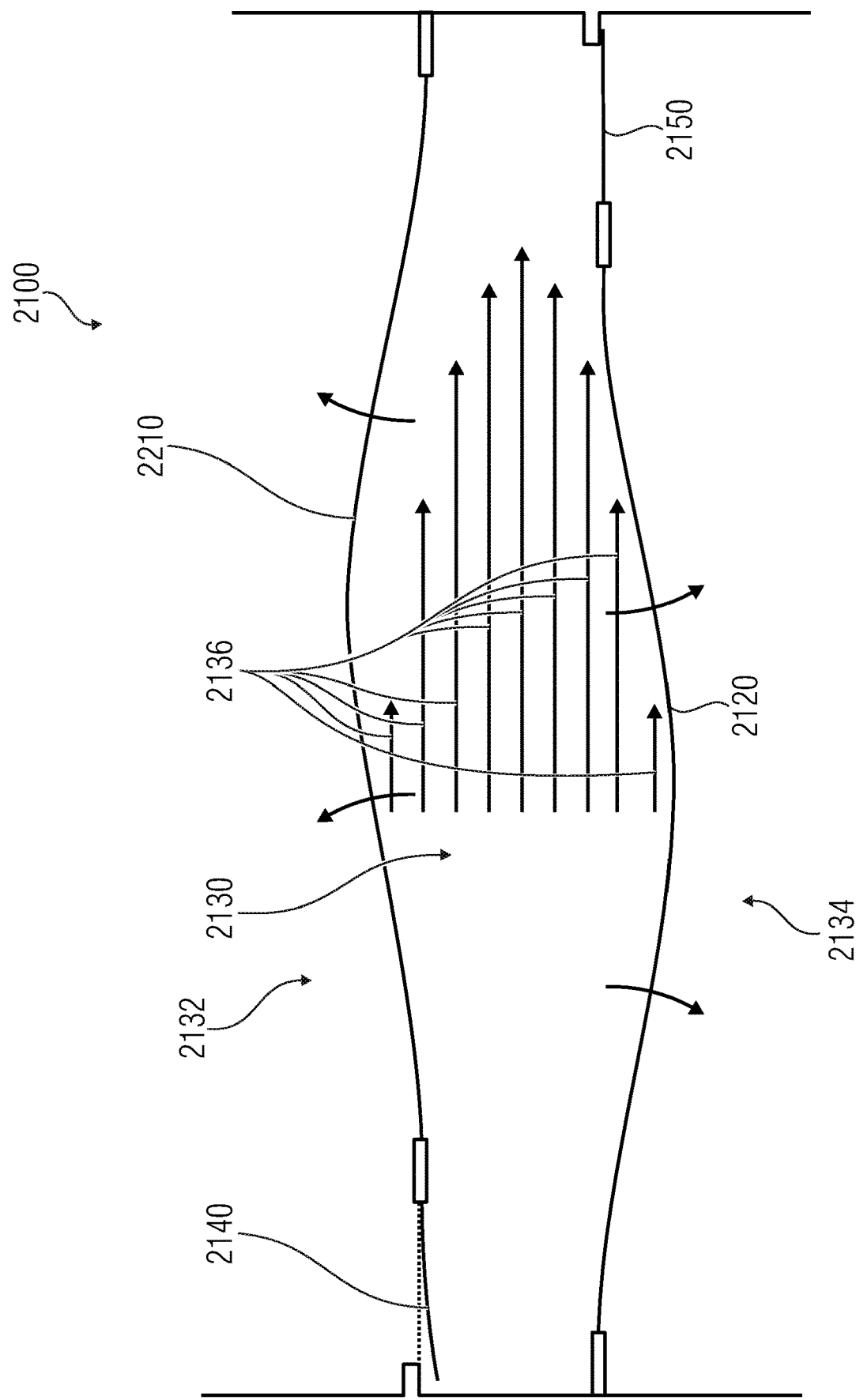
FIG. 21 shows a micromechanical pump according to embodiments of the sixth aspect of the present application
Figure 22:
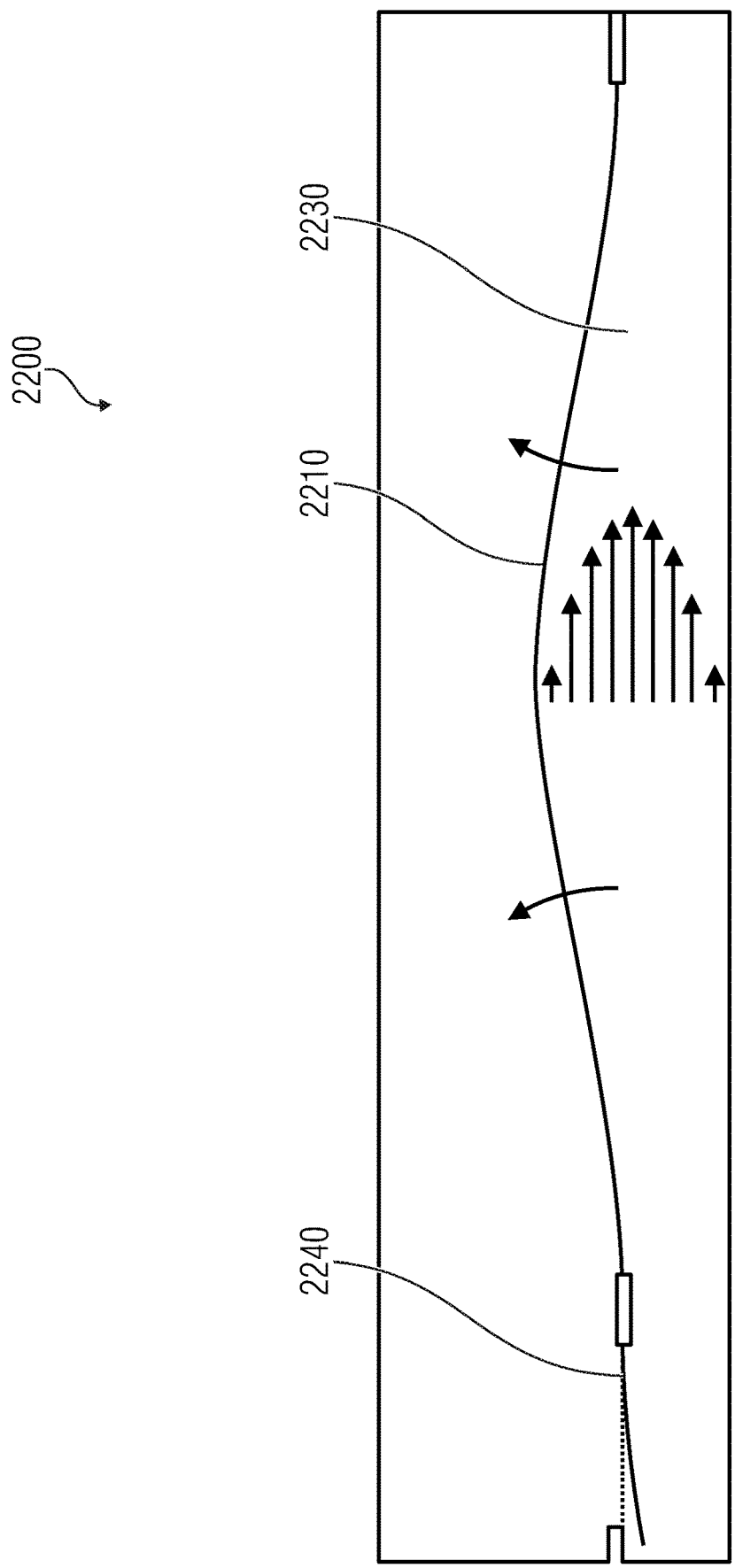
FIG. 22 shows a conventional micromechanical pump.

In FIG. 21 a micromechanical pump 2100 is shown according to embodiments of the sixth aspect of the present application. The micromechanical pump 2100 comprises a first planar micromechanical actuator 2110 and a second planar micromechanical actuator 2120, which are arranged along each other forming a fluid passage 2130 in between. The first planar micromechanical actuator 2110 and the second planar micromechanical actuator 2120 may be formed in a wafer and are arranged between parallel wall portions. One of the wall portions serves as a ground for the fluid passage 2130. Moreover, next to the first planar micromechanical actuator 2110 an inlet valve 2140 is arranged, configured to enable a fluid flow into the fluid passage 2130. Furthermore, next to the second planar micromechanical actuator 2120 an outlet valve 2150 is arranged configured to enable a fluid flow out of the fluid passage 2130. Adjacent to the first planar micromechanical actuator 2110, on a side opposing the fluid passage 2130, a first fluid volume 2132 is located from which a fluid is sucked into the fluid passage 2130 upon actuation of the first planar micromechanical actuator 2110 and the second planar micromechanical actuator 2120. Further, adjacent to the second planar micromechanical actuator 2130, on a side opposing the fluid passage 2130, a second fluid volume 2134 is located into which a fluid is pumped after actuation of the first planar micromechanical actuator 2110 and the second planar micromechanical actuator 2120, i.e. when returning into an non-actuated state. A fluid flows in direction 2136 along the first planar micromechanical actuator 2110 and the second planar micromechanical actuator 2120, upon actuation of the micromechanical pump 2100. The described micromechanical pump 2100 is especially beneficial due to its increased fluid passage width compared to a system with a single planar micromechanical actuator as illustrated in FIG. 22. The increased fluid passage incurs a reduced hydraulic resistance of the pump 2100. The micromechanical actutators 2110 and 2120 may be formed based on actuators described with respect to the aforementioned aspects. The valves 2140 and 2150 may be formed based on valves described with respect to the aforementioned aspects.

In FIG. 22 a micromechanical pump 2200 is illustrated using a single planar micromechanical actuator, wherein a fluid passage 2230 has a reduced width compared to the fluid passage 2130. Moreover, the pump 2200 comprises an check valve 2240 configured to only provide a fluid flow into one direction.

Comparing pump 2100 and pump 2200, pump 2100 is advantageous with respect to hydraulic resistance and flow rate. Using two pumps according to pump 2200 in parallel may yield a comparable flow rate compared to pump 2100. However, pump 2100 has a smaller hydraulic resistance due to its increased fluid passage width.

Further embodiments describe a microfluidic microsystem based on volume constriction using parietal actuators, a reconfigurable pump and a synchronization of entities (e.g. pumping entities or actuators). Embodiments use both sides of an actuator on two stacked fluidic chambers. Further embodiments consider the number of cells forming one actuator, consider relative position of stacked entities in order to increase a power density of a pump or consider size potential density of actuation (pressure and flowrate). Alternatively, embodiments describe reconfigurability through valves, which enable flowrate or pressure optimized operation. Embodiments describe pressure sensors (by inverting of an operation mechanism or through further mechanisms (plate capacitor, piezoresistors, etc.)) combined with 5+ sensors orthogonal to a fluid in-/outlet. Embodiments further describe a phase shift during an actuation of entities pumping in parallel in order to level the generated flowrate/pressure or of entities pumping in serial in order to increase a maximum back pressure of a system.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A planar micromechanical actuator suspended on opposing suspension zones comprising:
   a neutral axis between the opposing suspension zones,
   first to fourth segments into which the planar micromechanical actuator is segmented between the opposing suspension zones, each comprising a first electrode and a second electrode which form a capacitor and are isolatedly affixed to each other at opposite ends of the respective segment along a direction between the opposing suspension zones so as to form a gap between the first and second electrode along a thickness direction, the gap being offset to the neutral axis along the thickness direction, and
   wherein the first to fourth segments are configured such that the planar micromechanical actuator deflects into the thickness direction by the first and fourth segment bending into the thickness direction and the second and third segments bending contrary to the thickness direction upon a voltage being applied to the first and second electrodes of the first to fourth segments.

2. The planar micromechanical actuator according to claim 1, wherein the planar micromechanical actuator comprises exactly four segments.

3. The planar micromechanical actuator according to claim 1, wherein the gaps of the first and fourth segment are arranged on a first side of the neutral axis, and wherein the gaps of the second and third segment are arranged on a second side of the neutral axis, wherein the second side opposes the first side.

4. The planar micromechanical actuator according to claim 1, wherein the first and second electrodes of the respective segment are isolatedly affixed to each other by spacers.

5. The planar micromechanical actuator according to claim 4, wherein the spacers are formed, at least partially, from an insulating material.

6. The planar micromechanical actuator according to claim 1, wherein the gaps of the respective segments, neglecting the affixation, are of planar shape.

7. The planar micromechanical actuator according to claim 1, wherein each segment comprises a third electrode arranged along the second electrode on an opposite side of the neutral axis to the first electrode, and wherein for each segment the third electrode is isolatedly affixed to the second electrode at opposite ends of the respective segment along a direction between the opposing suspension zones so as to form a second gap in a direction opposite to the thickness direction between the third electrode and the second electrode.

8. A planar micromechanical actuator suspended on opposing suspension zones comprising:
a first, second and third electrode, wherein the second electrode is sandwiched between the first and third electrodes,
wherein the planar micromechanical actuator is segmented between the opposing suspension zones into a sequence of segments, wherein for each segment the first electrode and third electrode are isolatedly affixed to the second electrode at opposite ends of the respective segment along a direction between the opposing suspension zones,
wherein the sequence of segments is subdivided into a first to fourth subsequence of segments, each subsequence comprising one or more segments,
wherein in each segment of the first and fourth subsequences, the first, second and third electrodes are shaped to bulge towards a first direction and bend upon application of a voltage between the first and third electrodes on the one hand and the second electrode on the other hand into a second direction opposite to the first direction, and
wherein in each segment of the second and third subsequences, the first, second and third electrodes are shaped to bulge towards the second direction and bend upon application of the voltage between the first and third electrodes on the one hand and the second electrode on the other hand into the first direction,
wherein the first subsequence of segments, second subsequence of segments, third subsequence of segments and fourth subsequence of segments each cover a fourth of a distance between the opposing suspension zones.

9. The planar micromechanical actuator according to claim 8, wherein a joint, joining the second segment and third segment is configured to move along the second direction upon an actuation of the planar micromechanical actuator.

10. The planar micromechanical actuator according to claim 8, wherein each subsequence of segments comprises an identical number of segments.

11. The planar micromechanical actuator according to claim 8, wherein the planar micromechanical actuator comprises a neutral axis formed in the second electrode between the opposing suspension zones.

12. The planar micromechanical actuator according to claim 8, wherein each subsequence forming the sequence of segments comprises exactly one segment.

13. A planar micromechanical actuator according to claim 8, wherein the first and second electrode are affixed to each other by first spacers and the second and third electrode are affixed to each other by second spacers.

14. The planar micromechanical actuator according to claim 8, wherein the first electrode comprises a greater thickness than the third electrode in the first and fourth subsequence of the sequence of segments and wherein the first electrode comprises a smaller thickness than the third electrode in the second and third subsequence of the sequence of segments.

15. The planar micromechanical actuator according to claim 14, wherein the first and second electrode are affixed to each other by first spacers and the second and third electrode are affixed to each other by second spacers,
wherein the first and second spacers and the second electrode at the first and second spacers are formed such that an overall thickness of the planar micromechanical actuator remains constant on borders between the subsequences of segments.

16. The planar micromechanical actuator according to claim 15, wherein gaps formed between the first and second electrode and the first spacers are arc shaped, and
wherein gaps formed between the second and third electrode and the second spacers are arc shaped.

17. The planar micromechanical actuator according to claim 13, wherein the spacers are formed, at least partially, from an insulating material.

18. The planar micromechanical actuator according to claim 8, wherein in each segment of the first and fourth subsequences, an outer surface of the first electrode comprises a first curvature forming a protrusion of the planar micromechanical actuator in the respective segment, and wherein an outer surface of the third electrode directed oppositely to the outer surface of the first electrode comprises a second curvature forming a recess of the planar micromechanical actuator wherein the first curvature comprises a smaller radius than the second curvature.

19. The planar micromechanical actuator according to claim 8, wherein in each segment of the second and third subsequences, an outer surface of the first electrode comprises a first curvature forming a recess of the planar micromechanical actuator in the respective segment, and wherein an outer surface of the third electrode directed oppositely to the outer surface of the first electrode comprises a second curvature forming a protrusion of the micromechanical actuator wherein the first curvature comprises a greater radius than the second curvature.

20. A micromechanical actuator arrangement comprising a stack of planar micromechanical actuators comprising
a first planar micromechanical actuator comprising a first planar micromechanical actuator segment with a surface comprising a first curvature, and
a second planar micromechanical actuator comprising a second planar micromechanical actuator segment with a surface comprising a second curvature,
wherein the first curvature forms a recess in the first planar micromechanical actuator segment and the second curvature forms a protrusion of the second planar micromechanical actuator segment, and
wherein the surface of the first micromechanical planar actuator segment comprising the first curvature faces the surface of the second micromechanical planar actuator segment comprising the second curvature, and
wherein the first curvature comprises a greater radius than the second curvature, so that a distance between the surface of the first micromechanical planar actuator segment and the surface of the second micromechanical planar actuator segment is substantially laterally constant and is retained when deflecting the first planar micromechanical actuator segment and the second planar micromechanical actuator segment.

21. The micromechanical actuator arrangement according to claim 20, wherein each planar micromechanical actuator segment comprises a layer stack composed of a first, second and third electrode, wherein the second electrode is sandwiched between the first and the third electrode, and
   wherein the surface comprising the first curvature of the first planar micromechanical actuator segment is formed by the third electrode of the first planar micromechanical actuator segment, and
   wherein the surface comprising the second curvature of the second planar micromechanical actuator segment is formed by the first electrode of the second planar micromechanical actuator segment.

22. The micromechanical actuator arrangement according to claim 20, wherein the first and the second planar micromechanical actuator comprises sequences of planar micromechanical actuator segments.

23. The micromechanical actuator arrangement according to claim 20, wherein the first and the second planar micromechanical actuators are suspended between opposing suspension zones.

24. A micromechanical valve comprising a first fluid port, a second fluid port, a micromechanical actuator, and a fluid passage formed between the first fluid port and the second fluid port, the fluid passage comprising two opposite and parallel wall portions, wherein the micromechanical actuator is arranged in the fluid passage, and
   wherein the micromechanical actuator is configured to deflect in a plane parallel to the two parallel wall portions based on an activation signal provided to same such that the fluid passage between the first fluid port and the second fluid port is at least partially blocked by the micromechanical actuator; and at least one of
   wherein the micromechanical actuator comprises a closed contour, wherein the closed contour of the micromechanical actuator is configured to modulate its shape upon actuation of the micromechanical actuator;
   wherein the micromechanical actuator is planar and configured to deflect, upon activation, along a lateral direction between a suspension zone at which the micromechanical actuator is suspended and a unsuspended end of the micromechanical actuator so that the micromechanical actuator is arranged at a wall of the fluid passage connecting the two parallel wall portions when not being activated and the micromechanical actuator moves the unsuspended end into the fluid passage upon activation;
   wherein the micromechanical valve comprises a third and a fourth fluid port forming a crossing with the first and second fluid port, wherein the micromechanical actuator is planar and comprises two deflectable portions, wherein the micromechanical actuator is affixed between the two deflectable portions to at least one of the two parallel wall portions in the crossing, and wherein the micromechanical actuator is configured to enable a fluid flow between on one hand the first fluid port and on the other hand the second, third and fourth fluid ports, in a non-actuated position, or wherein the micromechanical actuator is configured to enable a fluid flow only between the first fluid port and the third fluid port and only between the second fluid port and the fourth fluid port upon actuation of the micromechanical actuator;
   wherein the micromechanical valve comprises a third and a fourth fluid port forming a crossing with the first and the second fluid port, wherein the micromechanical actuator is bent and comprises two deflectable portions, wherein the micromechanical actuator is affixed between the two deflectable portions to at least one of the two parallel wall portions in the crossing, and wherein the micromechanical actuator is configured to enable a fluid flow only between the first fluid port and the third fluid port and only between the second fluid port and the fourth fluid port, in a non-actuated position, or wherein the micromechanical actuator is configured to enable a fluid flow between on one hand the first fluid port and on the other hand the second, third and fourth fluid ports, in a first actuation state, or wherein the micromechanical actuator is configured to enable a fluid flow only between the first fluid port and the fourth fluid port and only between the second fluid port and the third fluid port, in a second actuation state; and
   wherein the micromechanical valve comprises a third and a fourth fluid port forming a crossing with the first and second fluid port, wherein the micromechanical actuator comprises a closed contour and is arranged in the crossing, and wherein the micromechanical actuator is configured to enable a fluid flow between on one hand the first fluid port and on the other hand the second, third and fourth fluid ports, in a non-actuated position, or wherein the micromechanical actuator is configured to enable a fluid flow only between the first fluid port and the third fluid port and only between the second fluid port and the fourth fluid port, in a first actuation state, or wherein the micromechanical actuator is configured to enable a fluid flow only between the first fluid port and the fourth fluid port and only between the second fluid port and the third fluid port, in a second actuation state.

25. The micromechanical valve according to claim 24, wherein the closed contour of the micromechanical actuator is of circular shape when not being actuated, and
   wherein the closed contour of the micromechanical actuator is configured to be of elliptical shape upon being actuated.

26. The micromechanical valve according to claim 24, wherein the closed contour of the micromechanical actuator is affixed to at least one of the two parallel wall portions at a point of the closed contour.

27. The micromechanical valve according to claim 24, wherein the closed contour of the micromechanical actuator is affixed by at least two springs to at least one of the two parallel wall portions, wherein the springs are affixed at one end at substantially opposite points of the closed contour of the micromechanical actuator and with another end affixed to points on at least one of the two parallel wall portions located within the closed contour.

28. The micromechanical valve according to claim 24, wherein the micromechanical actuator is configured to enable a fluid flow in a direction along the suspended end of the mechanical actuator to the unsuspended end of the micromechanical actuator and avoiding a fluid flow in a direction along the unsuspended end to the suspended end of the micromechanical actuator upon deflection of the micromechanical actuator.

29. The micromechanical valve according to claim 24, further comprising a further micromechanical actuator which is planar and configured to deflect, upon activation, along a lateral direction between a further suspension zone at which the further micromechanical actuator is suspended and a further unsuspended end of the further micromechanical actuator, wherein the further micromechanical actuator is arranged at the wall of the fluid passage connecting the opposite wall portions when not being activated and the further micromechanical actuator moves the further unsuspended end into the fluid passage upon activation, wherein, when seen along a predetermined direction within the fluid passage, the unsuspended end precedes the suspension zone, and the further suspension zone precedes the further unsuspended end.

30. The micromechanical valve according to claim 29, wherein the micromechanical valve is configured to enable a fluid flow in a direction from the further unsuspended end to the unsuspended end and to avoid a fluid flow in a direction from the unsuspended end to the further unsuspended end upon deflection of the unsuspended end of the micromechanical actuator.

31. The micromechanical valve according to claim 29, wherein the micromechanical valve is configured to enable a fluid flow in a direction along the unsuspended end to the further unsuspended end and to avoid a fluid flow in a direction along the further unsuspended end to the unsuspended end upon deflection of the further unsuspended end of the further micromechanical actuator.

32. The micromechanical valve according to claim 24, wherein the micromechanical actuator is affixed by at least two springs, wherein the springs are on one end attached on substantially opposite ends of the closed contour of the micromechanical actuator and on the other end attached to at least one of the two parallel wall portions.

33. The micromechanical valve according to claim 32, wherein the micromechanical actuator is affixed to at least one of the two parallel wall portions in the crossing at a point on the closed contour.

\* \* \* \* \*